(12) United States Patent
Yang et al.

(10) Patent No.: US 12,420,667 B2
(45) Date of Patent: *Sep. 23, 2025

(54) BATTERY PACK INTERNAL SHORT CIRCUIT DETECTION METHOD AND RELATED APPARATUS, AND ELECTRIC VEHICLE

(71) Applicant: SHENZHEN YINWANG INTELLIGENT TECHNOLOGIES CO., LTD., Shenzhen (CN)

(72) Inventors: Rui Yang, Shanghai (CN); Wei Cai, Shenzhen (CN); Lulu Zheng, Shanghai (CN)

(73) Assignee: SHENZHEN YINWANG INTELLIGENT TECHNOLOGIES CO., LTD., Shenzhen (CN)

( * ) Notice: Subject to any disclaimer, the term of this patent is extended or adjusted under 35 U.S.C. 154(b) by 951 days.

This patent is subject to a terminal disclaimer.

(21) Appl. No.: 17/490,242

(22) Filed: Sep. 30, 2021

(65) Prior Publication Data

US 2022/0016996 A1 Jan. 20, 2022

Related U.S. Application Data

(63) Continuation of application No. PCT/CN2020/080006, filed on Mar. 18, 2020.

(30) Foreign Application Priority Data

Apr. 2, 2019 (CN) .......................... 201910265369.8

(51) Int. Cl.
*B60L 58/18* (2019.01)
*G01R 31/3835* (2019.01)
*G01R 31/52* (2020.01)

(52) U.S. Cl.
CPC .......... *B60L 58/18* (2019.02); *G01R 31/3835* (2019.01); *G01R 31/52* (2020.01)

(58) Field of Classification Search
CPC ...................................................... G01R 31/52
See application file for complete search history.

(56) References Cited

U.S. PATENT DOCUMENTS 3,644,190 A * 2/1972 Weist ....................... H02H 7/00
 204/228.1
5,945,805 A * 8/1999 Takei .................. H02J 7/00047
 320/124

(Continued)

FOREIGN PATENT DOCUMENTS

CN 1174441 A 2/1998
CN 101034141 A 9/2007

(Continued)

OTHER PUBLICATIONS

EV Vision, "The number of new energy vehicles in China reaches 1.99 million! These new cars deserve your attention!," https://www.d1ev.com/carnews/daogou/72763, Jul. 23, 2018, 18 pages.

(Continued)

*Primary Examiner* — Drew A Dunn
*Assistant Examiner* — Tynese V McDaniel
(74) *Attorney, Agent, or Firm* — Conley Rose, P.C.

(57) ABSTRACT

A battery pack internal short circuit detection method applicable to an electric vehicle includes checking a voltage change of a target battery based on voltages of a reference battery in two charging processes, and determining whether the target battery has an internal short circuit based on the voltage change of the target battery; or checking a voltage change of a reference battery based on voltages of a target battery in two charging processes, and determining whether (Continued)

the target battery has an internal short circuit based on the voltage change of the reference battery.

20 Claims, 13 Drawing Sheets

(56) References Cited

U.S. PATENT DOCUMENTS

| | | | |
|---|---|---|---|
| 6,255,803 B1* | 7/2001 | Ishihara | G01R 31/3648 |
| | | | 320/136 |
| 7,795,843 B2 | 9/2010 | Keates et al. | |
| 8,049,465 B2 | 11/2011 | Barsoukov et al. | |
| 8,487,629 B2 | 7/2013 | Seo | |
| 8,643,332 B2 | 2/2014 | Yokotani | |
| 9,097,774 B2 | 8/2015 | White et al. | |
| 9,130,377 B2 | 9/2015 | Barsukov et al. | |
| 9,250,297 B2* | 2/2016 | He | G01R 31/385 |
| 9,774,197 B1* | 9/2017 | Li | H02J 7/0019 |
| 9,880,225 B2 | 1/2018 | Koba et al. | |
| 10,330,739 B2* | 6/2019 | Quiambao | H02J 7/00309 |
| 10,479,204 B2 | 11/2019 | Murai et al. | |
| 10,788,536 B2 | 9/2020 | Zhang et al. | |
| 11,031,796 B2 | 6/2021 | Yao et al. | |
| 11,275,125 B2* | 3/2022 | Yang | G01R 31/3842 |
| 2002/0109506 A1 | 8/2002 | Kawakami et al. | |
| 2006/0186859 A1* | 8/2006 | Fujikawa | G01R 31/52 |
| | | | 320/134 |
| 2009/0263683 A1 | 10/2009 | Baumann et al. | |
| 2010/0004885 A1* | 1/2010 | Nakanishi | G01R 31/3842 |
| | | | 324/426 |
| 2010/0188054 A1* | 7/2010 | Asakura | H01M 4/5825 |
| | | | 320/161 |
| 2011/0148426 A1* | 6/2011 | Yokotani | H01M 10/48 |
| | | | 324/537 |
| 2011/0181246 A1* | 7/2011 | Tae | H02J 7/0014 |
| | | | 320/118 |
| 2011/0184677 A1* | 7/2011 | Tae | G01R 31/396 |
| | | | 702/63 |
| 2011/0187329 A1 | 8/2011 | Majima et al. | |
| 2012/0032681 A1 | 2/2012 | Fink et al. | |
| 2012/0169288 A1* | 7/2012 | Ueki | H01M 50/50 |
| | | | 702/58 |
| 2012/0176140 A1 | 7/2012 | Kitsuani et al. | |
| 2012/0262126 A1 | 10/2012 | Boehm et al. | |
| 2013/0234672 A1 | 9/2013 | Kubota et al. | |
| 2014/0120389 A1 | 5/2014 | Fink | |
| 2014/0376137 A1 | 12/2014 | Wang et al. | |
| 2015/0377948 A1* | 12/2015 | Zhang | G01R 31/52 |
| | | | 324/426 |
| 2016/0054389 A1 | 2/2016 | Koba et al. | |
| 2016/0061907 A1 | 3/2016 | Koba et al. | |
| 2016/0190833 A1* | 6/2016 | Roumi | H02J 7/00 |
| | | | 320/136 |
| 2017/0155255 A1* | 6/2017 | Ono | H02J 7/0019 |
| 2017/0242077 A1 | 8/2017 | Guo et al. | |
| 2018/0041055 A1* | 2/2018 | Nakamoto | H01M 10/482 |
| 2018/0172772 A1 | 6/2018 | Yuan et al. | |
| 2019/0027943 A1 | 1/2019 | Rothschild | |
| 2019/0219640 A1* | 7/2019 | Liu | G01R 31/36 |
| 2019/0245252 A1* | 8/2019 | Mäki | H01M 10/482 |
| 2019/0305384 A1* | 10/2019 | Liu | G01R 31/367 |
| 2019/0353693 A1* | 11/2019 | Yang | H01M 10/44 |
| 2020/0049773 A1* | 2/2020 | Cho | G01R 31/3842 |
| 2020/0313152 A1* | 10/2020 | Stefanopoulou | H01M 50/578 |
| 2021/0257681 A1* | 8/2021 | Takahashi | G01R 31/396 |
| 2021/0286020 A1* | 9/2021 | Tawa | G01R 31/396 |
| 2021/0318386 A1* | 10/2021 | Itakura | B60L 3/12 |
| 2022/0077510 A1* | 3/2022 | Kishi | H02J 7/005 |
| 2022/0260640 A1* | 8/2022 | Tanaka | G01R 31/389 |
| 2022/0320611 A1* | 10/2022 | Mizuno | H01M 10/052 |
| 2023/0043802 A1* | 2/2023 | Baba | H02J 7/00302 |
| 2023/0194616 A1* | 6/2023 | Lee | H02J 7/007192 |
| | | | 324/426 |
| 2023/0331118 A1* | 10/2023 | Lee | B60L 3/0046 |
| 2023/0333170 A1* | 10/2023 | Kim | B60L 3/12 |
| 2023/0369660 A1* | 11/2023 | Lee | H01M 10/482 |
| 2024/0044999 A1* | 2/2024 | Park | H02J 7/0014 |
| 2024/0133972 A1* | 4/2024 | Sung | B60L 3/0046 |
| 2024/0178467 A1* | 5/2024 | Chinen | H01M 10/48 |
| 2025/0060416 A1* | 2/2025 | Kim | G01R 31/52 |

FOREIGN PATENT DOCUMENTS

| | | |
|---|---|---|
| CN | 101622547 A | 1/2010 |
| CN | 101765941 A | 6/2010 |
| CN | 201623512 U | 11/2010 |
| CN | 101957433 A | 1/2011 |
| CN | 1821801 B | 5/2011 |
| CN | 102104180 A | 6/2011 |
| CN | 102282477 A | 12/2011 |
| CN | 102395896 A | 3/2012 |
| CN | 102565611 A | 7/2012 |
| CN | 102576895 A | 7/2012 |
| CN | 103138017 A | 6/2013 |
| CN | 103545564 A | 1/2014 |
| CN | 103636030 A | 3/2014 |
| CN | 104035048 A | 9/2014 |
| CN | 103138026 B | 3/2015 |
| CN | 104614630 A | 5/2015 |
| CN | 104614631 A | 5/2015 |
| CN | 104614632 A | 5/2015 |
| CN | 102136743 B | 7/2015 |
| CN | 104833919 A | 8/2015 |
| CN | 105190330 A | 12/2015 |
| CN | 105807226 A | 7/2016 |
| CN | 106802396 A | 6/2017 |
| CN | 106932722 A | 7/2017 |
| CN | 107064803 A | 8/2017 |
| CN | 107192914 A | 9/2017 |
| CN | 107870301 A | 4/2018 |
| CN | 108241102 A | 7/2018 |
| CN | 108562855 A | 9/2018 |
| DE | 69837661 T2 | 12/2007 |
| DE | 102008005530 A1 | 7/2009 |
| EP | 0992100 B1 | 4/2007 |
| EP | 1158306 B1 | 2/2008 |
| EP | 2343558 A2 | 7/2011 |
| EP | 2428809 A2 | 3/2012 |
| GB | 2337336 A | 11/1999 |
| JP | H11118891 A | 4/1999 |
| JP | 2009145137 A | 7/2009 |
| JP | 2014002009 A | 1/2014 |
| JP | 5652802 B2 | 1/2015 |
| JP | 5768769 B2 | 8/2015 |
| JP | 2016075567 A | 5/2016 |
| JP | 2016090399 A | 5/2016 |
| JP | 2018055910 A | 4/2018 |
| JP | 2019020310 A | 2/2019 |
| WO | 2018059074 A1 | 4/2018 |
| WO | 2018124721 A1 | 7/2018 |
| WO | 2018196121 A1 | 11/2018 |

OTHER PUBLICATIONS

Rong, L., "Ouyang Minggao's speech is fully collected, and the battery safety analysis "full text + PPT" is released for the first time," Global Future Mobility Conference, Sep. 22, 2018, https://www.leiphone.com/category/transportation/wjVzGc7vtbpUimU6.html, 24 pages.

Author of the first electric big cow, "Weird! Those unexplained Tesla Model S fire accidents," Tesla, Apr. 5, 2017, https://www.d1ev.com/kol/50532, 8 pages.

Guo Hong-xia et al., "Fast determination of micro short circuit in sintered MH-Ni battery," Chinese Journal of PowerSources, vol. 34, No. 6, Jun. 2010, 5 pages, with english translation.

* cited by examiner

S52: Measure voltages of a reference battery and a target battery in a first charging process of a battery pack, where a voltage value of the reference battery at a first moment t1 is a first voltage $V_{set1}$, a voltage value of the target battery at the first moment t1 is a second voltage V2(t1), and the battery pack includes the reference battery and the target battery S54: Measure voltages of the reference battery and the target battery in a second charging process of the battery pack, where a voltage value of the reference battery at a second moment t2 is the first voltage $V_{set1}$, and a voltage value of the target battery at the second moment t2 is a third voltage V2(t2)

S56: Determine, based on the second voltage V2(t1) and the third voltage V2(t2), whether the target battery has an internal short circuit

FIG. 5A

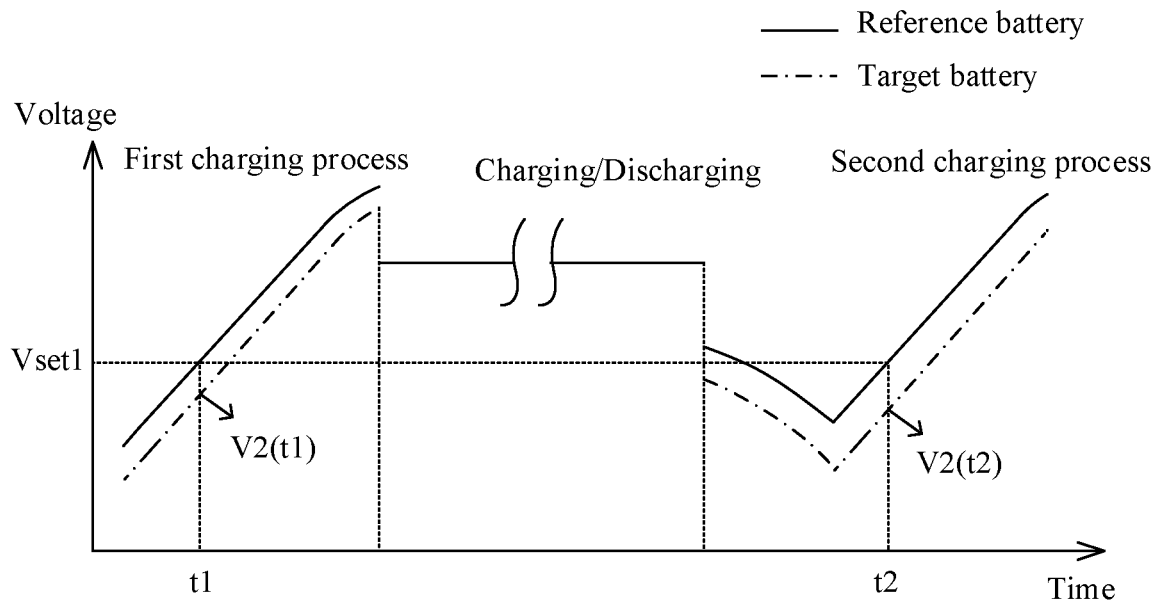

FIG. 5B

OCV-SOC curve of a battery

S62: Measure terminal voltages of a reference battery and a target battery in a first charging process of a battery pack, where a voltage value of the reference battery at a third moment t3 is a fifth voltage V1(t3), a voltage value of the target battery at the third moment t3 is a fourth voltage $V_{set2}$, and the battery pack includes the reference battery and the target battery S64: Measure voltages of the reference battery and the target battery in a second charging process of the battery pack, where a voltage value of the target battery at a fourth moment t4 is the fourth voltage $V_{set2}$, and a voltage value of the reference battery at the fourth moment t4 is a sixth voltage V1(t4)

S66: Determine, based on the fifth voltage V1(t3) and the sixth voltage V1(t4), whether the target battery has an internal short circuit

FIG. 6A

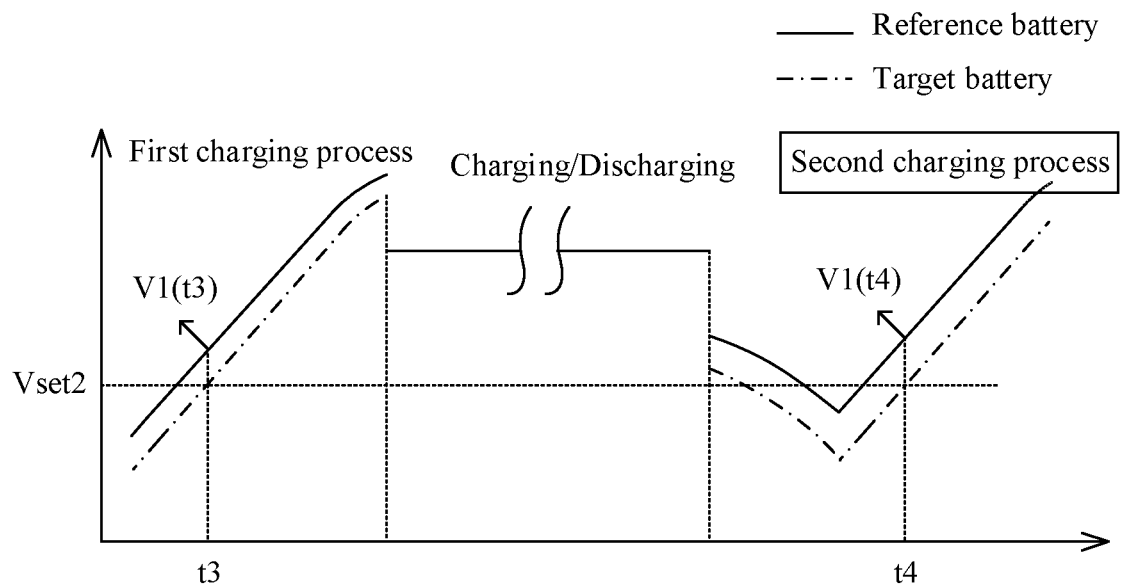

FIG. 6B

S72: Measure voltages of a reference battery and a target battery in a first charging process of a battery pack, where a voltage value of the reference battery at a first moment t1 is a first voltage $V_{set1}$, a voltage value of the target battery at the first moment t1 is a second voltage V2(t1), a voltage value of the target battery at a third moment t2 is a fourth voltage $V_{set2}$, a voltage value of the reference battery at the third moment t3 is a fifth voltage V1(t3), the battery pack includes the reference battery and the target battery, and the third moment t3 is a moment after the first moment t1

S74: Perform balanced discharging on the reference battery from a fifth moment t5 to a sixth moment t6 by using a balancing circuit corresponding to the reference battery, and measure voltages of the reference battery from the fifth moment t5 to the sixth moment t6, where the fifth moment t5 is a moment after the third moment t3

S76: Measure voltages of the reference battery and the target battery in a second charging process of the battery pack, where a voltage value of the reference battery at a second moment t2 is the first voltage $V_{set1}$, a voltage value of the target battery at the second moment t2 is a third voltage V2(t2), a voltage value of the target battery at a fourth moment t4 is the fourth voltage $V_{set2}$, and a voltage value of the reference battery at the fourth moment t2 is a sixth voltage V1(t4)

S78: Calculate an internal short circuit resistance of the target battery based on the voltages of the reference battery in the balanced discharging process, the voltages of the target battery that are measured from the first moment t1 to the fourth moment t4, the fifth voltage V1(t3), and the sixth voltage V1(t4)

FIG. 7A

S82: Measure voltages of a reference battery, a target battery, and an auxiliary battery in a first charging process of a battery pack, where a voltage value of the reference battery at a first moment t1 is a first voltage $V_{set1}$, a voltage value of the target battery at the first moment t1 is a second voltage $V2(t1)$, a voltage value of the auxiliary battery at the first moment t1 is a seventh voltage $V3(t1)$, and the battery pack includes the auxiliary battery, the target battery, and the reference battery

S84: Perform balanced discharging on the auxiliary battery from a seventh moment t7 to an eighth moment t8 by using a balancing circuit corresponding to the auxiliary battery, and measure voltages of the auxiliary battery from the seventh moment t7 to the eighth moment t8, where the seventh moment t7 is a moment after the first moment t1

S86: Measure voltages of the reference battery, the target battery, and the auxiliary battery in a second charging process of the battery pack, where a voltage value of the reference battery at a second moment t2 is the first voltage $V_{set1}$, a votlage value of the target battery at the second moment t2 is a third voltage $V2(t2)$, and a voltage value of the auxiliary battery at the second moment t2 is an eighth voltage $V3(t2)$

S88: Calculate an internal short circuit resistance of the target battery based on the voltages of the auxiliary battery in the balanced discharging process, the voltages of the target battery that are measured from the first moment t1 to the second moment t2, the seventh voltage $V3(t1)$, and the eighth voltage $V3(t2)$

FIG. 8A

BATTERY PACK INTERNAL SHORT CIRCUIT DETECTION METHOD AND RELATED APPARATUS, AND ELECTRIC VEHICLE

CROSS-REFERENCE TO RELATED APPLICATIONS

This is a continuation of International Patent Application No. PCT/CN2020/080006 filed on Mar. 18, 2020, which claims priority to Chinese Patent Application No. 201910265369.8 filed on Apr. 2, 2019. The disclosures of the aforementioned applications are hereby incorporated by reference in their entireties.

TECHNICAL FIELD

This application relates to the field of secondary battery technologies, and in particular, to a battery pack (especially an electric vehicle battery pack) internal short circuit detection method and related apparatus, and an electric vehicle.

BACKGROUND

A requirement on an energy density of a rechargeable battery (or a secondary battery) is increasingly high in the fields such as energy storage and electric vehicles. However, while the energy density of the battery is improved, safety problems of the rechargeable battery are accordingly becoming more severe. The safety problems of the rechargeable battery mainly include overcharge, over-discharge, internal short circuit, over-temperature, and the like. The overtemperature easily causes thermal runaway of the rechargeable battery, and further causes serious accidents such as fire and explosion. A study finds that a main reason why the rechargeable battery evolves from overtemperature to thermal runaway is an internal short circuit of the rechargeable battery caused by environmental overtemperature, mechanical abuse, spontaneous lithium plating, and the like. The environmental overtemperature and the mechanical abuse are related to external factors. However, a spontaneous internal short circuit of the rechargeable battery is accidental, and is caused by a metal foreign matter mixed in a manufacturing process of the rechargeable battery, a defect in a material, continuous growth of lithium dendrites produced by cycle use, or the like. For example, FIG. 1 is a schematic diagram of forming an internal short circuit in a lithium-ion battery in a battery pack due to a metal foreign matter piercing a membrane during manufacturing. An internal short circuit resistance of the lithium-ion battery is related to a size of the metal foreign matter and a quantity of short circuit points. In addition, because of continuous heat emission at the short circuit points, the metal foreign matter in the membrane gradually increases and the short circuit resistance gradually decreases. Accordingly, an amount of heat emitted by the lithium-ion battery due to the internal short circuit gradually increases. When the amount of heat emitted by the lithium-ion battery exceeds an upper limit that can be borne by a battery system, thermal runaway is triggered. A degree of the internal short circuit may be evaluated by using the internal short circuit resistance of the battery. A smaller internal short circuit resistance indicates a greater degree of the internal short circuit of the battery, and thermal runaway is more likely to occur. Therefore, identification of the internal short circuit of the rechargeable battery and calculation of the internal short circuit resistance of the rechargeable battery are important issues in battery safety management.

However, in the conventional technology, when a battery internal short circuit is identified or a battery internal short circuit resistance is calculated, an estimation parameter is usually used. As a result, precision of calculating or identifying an internal short circuit of a battery pack is low, and a misjudgment is easily caused.

SUMMARY

Embodiments of this application provide a battery pack internal short circuit detection method and related apparatus, and an electric vehicle, to overcome a problem in the conventional technology that precision of calculating or identifying, based on estimation, an internal short circuit of a battery is low, and a misjudgment is easily caused.

According to a first aspect, an embodiment of this application provides a battery pack internal short circuit detection method. The method includes measuring, by a battery management unit, voltages of a reference battery and a target battery in a first charging process of a battery pack, where a voltage value of the reference battery at a first moment t1 is a first voltage $V_{set1}$, a voltage value of the target battery at the first moment t1 is a second voltage $V2(t1)$, and the battery pack includes the reference battery and the target battery, measuring voltages of the reference battery and the target battery in a second charging process of the battery pack, where a voltage value of the reference battery at a second moment t2 is the first voltage $V_{set1}$, and a voltage value of the target battery at the second moment t2 is a third voltage $V2(t2)$, and then, determining, based on the second voltage value $V2(t1)$ and the third voltage $V2(t2)$, whether the target battery has an internal short circuit.

Optionally, if a difference between the second voltage $V2(t1)$ and the third voltage $V2(t2)$ is greater than a first threshold, the target battery has an internal short circuit. Otherwise, the target battery does not have an internal short circuit.

It should be understood that a voltage of a battery (the target battery, the reference battery, or the like) refers to a terminal voltage, namely, a voltage at two ends of the battery, and is equal to a difference between an open-circuit voltage (OCV) of the battery and a voltage drop on an internal resistance of the battery.

It should be further understood that the embodiments of this application are described only by using an example in which an execution body is the battery management unit. The battery pack internal short circuit detection method may also be performed by a vehicle controller, a battery pack internal short circuit detection apparatus, an apparatus that includes a battery pack, a terminal, a vehicle, or the like.

It should be further understood that this embodiment of this application is described only by using an example in which the execution body is the battery management unit. The battery pack internal short circuit detection method may also be performed by a vehicle controller, an apparatus that includes a battery pack, a terminal, a vehicle, or the like.

In the foregoing method, the battery management unit compares voltages of the target battery at two different moments by using the reference battery as a reference, to qualitatively determine whether an internal short circuit occurs in the battery. In addition, in a process of identifying the internal short circuit of the battery, only a voltage value that can be accurately measured is considered, and calculation of an estimated quantity is not involved, thereby improving precision and accuracy of identifying the internal short circuit.

With reference to the first aspect, in a first possible implementation of this embodiment of this application, in the first charging process, a voltage value of the target battery at a third moment t3 is a fourth voltage $V_{set2}$, and a voltage value of the reference battery at the third moment t3 is a fifth voltage V1(t3), in the second charging process, a voltage value of the target battery at a fourth moment t4 is the fourth voltage $V_{set2}$, and a voltage value of the reference battery at the fourth moment t4 is a sixth voltage V1(t4), the battery management unit may further perform balanced discharging on the reference battery from a fifth moment t5 to a sixth moment t6, that is, after the third moment t3 and before the second moment t2, and measure voltages of the reference battery in a balanced discharging process, and further, after the battery pack is charged for a second time, the battery management unit may calculate an internal short circuit resistance of the target battery based on the voltages of the reference battery in the balanced discharging process, the voltages of the target battery that are measured from the first moment t1 to the fourth moment t4, the fifth voltage V1(t3), and the sixth voltage V1(t4).

It should be understood that a balancing circuit corresponding to the reference battery is configured to perform energy dissipation on the reference battery, and usually includes a resistor R1 connected in parallel to the reference battery, and a switch connected in series to the resistor R1. When the battery management unit controls the switch to be closed, energy of the reference battery is dissipated through the resistor R1.

By performing the foregoing method, quantitative calculation of an internal short circuit resistance may be implemented, and in a calculation process of the internal short circuit resistance, calculation is not performed based on an estimated quantity, for example, a state of charge (SOC), an internal resistance, or a battery capacity. Calculation of an internal short circuit of a battery is decoupled from an estimated quantity of the battery by using a relative variation of a voltage of the battery, to reduce calculation complexity and improve calculation efficiency and precision of the internal short circuit resistance of the battery.

With reference to the first aspect, in a second possible implementation of this embodiment of this application, the battery management unit may further detect a voltage of an auxiliary battery in the first charging process of the battery pack, where a voltage value of the auxiliary battery at the first moment t1 is a seventh voltage V3(t1), and the voltage of the auxiliary battery is higher than the voltage of the target battery, perform balanced discharging on the auxiliary battery from a seventh moment t7 to an eighth moment t8, and measure voltages of the auxiliary battery in a balanced discharging process, where the seventh moment is a moment after the third moment, detect a voltage of the auxiliary battery in the second charging process of the battery pack, where a voltage value of the auxiliary battery at the second moment t2 is an eighth voltage V3(t2), and calculate an internal short circuit resistance of the target battery based on the voltages of the auxiliary battery in the balanced discharging process, the voltages of the target battery that are measured from the first moment t1 to the second moment t2, the seventh voltage V3(t1), and the eighth voltage V3(t2).

By performing the foregoing method, quantitative calculation of the internal short circuit resistance may be implemented, and in a calculation process of the internal short circuit resistance, calculation is not performed based on an estimated quantity, for example, an SOC, an internal resistance, or a battery capacity. Calculation of an internal short circuit of a battery is decoupled from an estimated quantity of the battery by using a relative variation of a voltage of the battery, to reduce calculation complexity and improve calculation efficiency and precision of the internal short circuit resistance of the battery.

According to a second aspect, an embodiment of this application further provides another battery pack internal short circuit detection method. The method includes measuring, by a battery management unit, terminal voltages of a reference battery and a target battery in a first charging process of a battery pack, where a voltage value of the target battery at a third moment t3 is a fourth voltage $V_{set2}$, a voltage value of the reference battery at the third moment t3 is a fifth voltage V1(t3), and the battery pack includes the reference battery and the target battery, measuring voltages of the reference battery and the target battery in a second charging process of the battery pack, where a voltage value of the target battery at a fourth moment t4 is the fourth voltage $V_{set2}$, and a voltage value of the reference battery at the fourth moment t4 is a sixth voltage V1(t4), and further, determining, based on the fifth voltage V1(t3) and the sixth voltage V1(t4), whether the target battery has an internal short circuit.

Optionally, if a difference between the fifth voltage V1(t3) and sixth voltage V1(t4) is greater than a second threshold, the target battery has an internal short circuit. Otherwise, the target battery does not have an internal short circuit.

To perform the foregoing method, the battery management unit compares voltages of the reference battery at two different moments by using the target battery as a reference, to qualitatively determine whether an internal short circuit occurs in the target battery. In addition, in a process of identifying the internal short circuit of the battery, calculation of an estimated quantity is not involved, and only a voltage value that can be accurately measured is considered, thereby improving precision and accuracy of identifying the internal short circuit.

With reference to the second aspect, in a first implementation of this embodiment of this application, in the first charging process, a voltage value of the reference battery at a first moment t1 is a first voltage $V_{set1}$, a voltage value of the target battery at the first moment t1 is a second voltage V2(t1), and the fourth voltage $V_{set2}$ is greater than the second voltage V2(t1), in the second charging process, a voltage value of the reference battery at a second moment t2 is the first voltage $V_{set1}$, and a voltage value of the target battery at the second moment t2 is a third voltage V2(t2), the battery management unit may further perform balanced discharging on the reference battery from a fifth moment t5 to a sixth moment t6, that is, after the third moment t3 and before the second moment t2, and measure voltages of the reference battery in a balanced discharging process, and further, after the battery pack is charged for a second time, an internal short circuit resistance of the target battery is calculated based on the voltages of the reference battery in the balanced discharging process, the voltages of the target battery that are measured from the first moment t1 to the fourth moment t4, the fifth voltage V1(t3), and the sixth voltage V1(t4).

By performing the foregoing method, quantitative calculation of the internal short circuit resistance may be implemented, and in a calculation process of the internal short circuit resistance, calculation is not performed based on an estimated quantity, for example, an SOC, an internal resistance, or a battery capacity. Calculation of an internal short circuit of a battery is decoupled from an estimated quantity of the battery by using a relative variation of a voltage of the battery, to reduce calculation complexity and improve calculation efficiency and precision of the internal short circuit resistance of the battery.

With reference to the second aspect, in a second implementation of this embodiment of this application, in the first charging process of the battery pack, a voltage of an auxiliary battery is detected, where a voltage value of the reference battery at a first moment t1 is a first voltage $V_{set1}$, a voltage value of the target battery at the first moment t1 is a second voltage $V2(t1)$, a voltage value of the auxiliary battery at the first moment t1 is a seventh voltage $V3(t1)$, and the voltage of the auxiliary battery is higher than the voltage of the target battery, further, after the first moment t1, the battery management unit may perform balanced discharging on the auxiliary battery from a seventh moment t7 to an eighth moment t8, and measure voltages of the auxiliary battery in a balanced discharging process, further, in the second charging process of the battery pack, a voltage of the auxiliary battery is detected, where a voltage value of the reference battery at a second moment t2 is the first voltage $V_{set1}$, a voltage value of the target battery at the second moment t2 is a third voltage $V2(t2)$, a voltage value of the auxiliary battery at the second moment t2 is an eighth voltage $V3(t2)$, and the second moment t2 is a moment after the eighth moment t8, and further, an internal short circuit resistance of the target battery is calculated based on the voltages of the auxiliary battery in the balanced discharging process, the voltages of the target battery that are measured from the first moment t1 to the second moment t2, the seventh voltage $V3(t1)$, and the eighth voltage $V3(t2)$.

According to a third aspect, an embodiment of this application further provides a battery internal short circuit detection method. The method includes measuring voltages of a reference battery and a target battery in a first charging process of a battery pack, where a voltage value of the reference battery at a first moment t1 is a first voltage $V_{set1}$, a voltage value of the target battery at the first moment t1 is a second voltage $V2(t1)$, a voltage value of the target battery at a third moment t3 is a fourth voltage $V_{set2}$, a voltage value of the reference battery at the third moment t3 is a fifth voltage $V1(t3)$, and the battery pack includes the reference battery and the target battery, performing balanced discharging on the reference battery from a fifth moment t5 to a sixth moment t6 by using a balancing circuit corresponding to the reference battery, and measuring voltages of the reference battery from the fifth moment t5 to the sixth moment t6, where the fifth moment t5 is a moment after the third moment t3, measuring voltages of the reference battery and the target battery in a second charging process of the battery pack, where a voltage value of the reference battery at a second moment t2 is the first voltage $V_{set1}$, a voltage value of the target battery at the second moment t2 is a third voltage $V2(t2)$, a voltage value of the target battery at a fourth moment t4 is the fourth voltage $V_{set2}$, and a voltage value of the reference battery at the fourth moment t2 is a sixth voltage $V1(t4)$, and further, calculating an internal short circuit resistance of the target battery based on voltages of the reference battery in a balanced discharging process, the voltages of the target battery that are measured from the first moment t1 to the fourth moment t4, the fifth voltage $V1(t3)$, and the sixth voltage $V1(t4)$.

By performing the foregoing method, quantitative calculation of the internal short circuit resistance may be implemented, and in a calculation process of the internal short circuit resistance, calculation is not performed based on an estimated quantity, for example, an SOC, an internal resistance, or a battery capacity. Calculation of an internal short circuit of a battery is decoupled from an estimated quantity of the battery by using a relative variation of a voltage of the battery, to reduce calculation complexity and improve calculation efficiency and precision of the internal short circuit resistance of the battery.

Optionally, a specific implementation of calculating the internal short circuit resistance of the target battery may be calculating, by a battery management unit, a difference between the voltages of the reference battery at the third moment t1 and the fourth moment t4 based on the fifth voltage $V1(t3)$ and the sixth voltage $V1(t4)$, calculating a difference between the voltages of the target battery at the first moment t1 and the second moment t2 based on the second voltage $V2(t1)$ and the third voltage $V2(t2)$, calculating integral values of the voltages of the reference battery from the fifth moment t5 to the sixth moment t6, integral values of the voltages of the target battery from the first moment t1 to the second moment t2, and integral values of the voltages of the target battery from the third moment t3 to the fourth moment t4, and then, calculating the internal short circuit resistance of the target battery based on the difference of between the voltages of the reference battery at the third moment t1 and the fourth moment t4, the difference of between the voltages of the target battery at the first moment t1 and the second moment t2, the integral values of the voltages of the reference battery from the fifth moment t5 to the sixth moment t6, the integral values of the voltages of the target battery from the first moment t1 to the second moment t2, and the integral values of the voltages of the target battery from the third moment t3 to the fourth moment t4.

According to a fourth aspect, an embodiment of this application further provides a battery pack internal short circuit detection method. The method may include measuring voltages of a reference battery, a target battery, and an auxiliary battery in a first charging process of a battery pack, where a voltage value of the reference battery at a first moment t1 is a first voltage $V_{set1}$, a voltage value of the target battery at the first moment t1 is a second voltage $V2(t1)$, a voltage value of the auxiliary battery at the first moment t1 is a seventh voltage $V3(t1)$, and the battery pack includes the auxiliary battery, the target battery, and the reference battery, performing balanced discharging on the auxiliary battery from a seventh moment t7 to an eighth moment t8 by using a balancing circuit corresponding to the auxiliary battery, and measuring voltages of the auxiliary battery from the seventh moment t7 to the eighth moment t8, where the seventh moment t7 is a moment after the first moment t1, measuring voltages of the reference battery, the target battery, and the auxiliary battery in a second charging process of the battery pack, where a voltage value of the reference battery at a second moment t2 is the first voltage $V_{set1}$, a voltage value of the target battery at the second moment t2 is a third voltage $V2(t2)$, and a voltage value of the auxiliary battery at the second moment t2 is an eighth voltage $V3(t2)$, and then, calculating an internal short circuit resistance of the target battery based on voltages of the auxiliary battery in a balanced discharging process, the voltages of the target battery that are measured from the first moment t1 to the second moment t2, the seventh voltage $V3(t1)$, and the eighth voltage $V3(t2)$.

By performing the foregoing method, quantitative calculation of the internal short circuit resistance may be implemented, and in a calculation process of the internal short circuit resistance, calculation is not performed based on an estimated quantity, for example, an SOC, an internal resistance, or a battery capacity. Calculation of an internal short circuit of a battery is decoupled from an estimated quantity of the battery by using a relative variation of a voltage of the battery, to reduce calculation complexity and improve calculation efficiency and precision of the internal short circuit resistance of the battery.

Optionally, a specific implementation of calculating the internal short circuit resistance of the target battery may be calculating, by a battery management unit, a difference between the voltages of the target battery at the first moment t1 and the second moment t2 based on the second voltage $V2(t1)$ and the third voltage $V2(t2)$, calculating a difference between the voltages of the auxiliary battery at the first moment t1 and the second moment t2 based on the seventh voltage $V3(t1)$ and the eighth voltage $V3(t2)$, calculating integral values of the voltages of the auxiliary battery from the seventh moment t7 to the eighth moment t8, and integral values of the voltages of the target battery from the first moment t1 to the second moment t2, and then, calculating the internal short circuit resistance of the target battery based on the difference between the voltages of the target battery at the first moment t1 and the second moment t2, the difference between the voltages of the auxiliary battery at the first moment t1 and the second moment t2, the integral values of the voltages of the auxiliary battery from the seventh moment t7 to the eighth moment t8, and the integral values of the voltages of the target battery from the first moment t1 to the second moment t2.

With reference to the third aspect or the fourth aspect, in a first implementation of this embodiment of this application, the target battery may be a battery that has an internal short circuit and that is detected by using the battery pack internal short circuit detection method according to the first aspect or the second aspect, or may be a battery that has an internal short circuit and that is determined by using a method for qualitatively identifying a battery internal short circuit in the conventional technology. In this case, the battery management unit may perform processing at different levels based on the calculated internal short circuit resistance.

With reference to the third aspect or the fourth aspect, in the first implementation of this embodiment of this application, the method may further include determining, based on the internal short circuit resistance of the target battery, whether the target battery has an internal short circuit, and/or performing alarming at different levels based on the calculated internal short circuit resistance. For example, when the internal short circuit resistance of the target battery is less than a first resistance value, the target battery is identified to have an internal short circuit.

With reference to the first implementation of the first aspect, the first implementation of the second aspect, the third aspect, or any implementation of the third aspect, in an implementation of this embodiment of this application, a calculation formula of the internal short circuit resistance of the target battery is:

$$RSC = \frac{\Delta V1 \times \int_{t1}^{t2} V2(t)dt + \Delta V2 \times \int_{t3}^{t4} V2(t)dt}{\Delta V1 \times \int_{t5}^{t6} V1(t)dt + \Delta V2 \times \int_{t5}^{t6} V1(t)dt} \times R1.$$

In the formula, $\Delta V1=V1(t3)-V1(t4)$, $\Delta V2=V2(t1)-V2(t2)$, RSC is the internal short circuit resistance, R1 is a resistance value of a load in the balancing circuit of the reference battery, $V1(t)$ is a function of the voltage of the reference battery relative to a time variable t, and $V2(t)$ is a function of the voltage of the target battery relative to the time variable t.

With reference to the first implementation of the first aspect, the first implementation of the second aspect, the third aspect, or any implementation of the third aspect, the method may further include in a process of performing balanced discharging on the reference battery, measuring an average resistance of batteries in the battery pack, and stopping performing balanced discharging on the reference battery at a sixth moment t6, where at the sixth moment t6, a difference between the voltage of the reference battery at the sixth moment t6 and an average voltage of the batteries in the battery pack at the sixth moment t6 is not greater than a preset threshold.

With reference to the first aspect, the first implementation of the first aspect, the second aspect, the first implementation of the second aspect, the third aspect, or any implementation of the third aspect, in another implementation of this embodiment of this application, the battery management unit may further determine, based on a voltage that is of each battery in the battery pack and that is measured in the first charging process, that the reference battery is a battery corresponding to a maximum voltage value, and determine that the target battery is any battery other than the reference battery in the battery pack, or, the battery management unit may further determine, based on a voltage that is of each battery in the battery pack and that is measured in the first charging process, that the reference battery is any one of batteries whose voltage values are greater than a first voltage threshold in the battery pack, and determine that the target battery is any one of batteries whose voltage values are less than the first voltage threshold in the battery pack. Optionally, the first voltage threshold may be an average value of measured voltages of the batteries in the battery pack.

With reference to the second implementation of the first aspect, the second implementation of the second aspect, the fourth aspect, or any implementation of the fourth aspect, in still another implementation of this embodiment of this application, a calculation formula of the internal short circuit resistance of the target battery is:

$$RSC = \frac{\Delta V3}{\Delta V2} \times \frac{\int_{t1}^{t2} V2(t)dt}{\int_{t7}^{t8} V3(t)dt} \times R3.$$

In the formula, $\Delta V3=V3(t2)-V3(t1)$, $\Delta V2=V2(t2)-V2(t1)$, RSC is the internal short circuit resistance, R3 is a resistance value of a load in the balancing circuit corresponding to the auxiliary battery, $V3(t)$ is a function of the voltage of the auxiliary battery relative to a time variable t, and $V2(t)$ is a function of the voltage of the target battery relative to the time variable t.

With reference to the second implementation of the first aspect, the second implementation of the second aspect, the fourth aspect, or any implementation of the fourth aspect, in the process of performing balanced discharging on the reference battery, an average resistance of batteries in the battery pack is measured, and the balanced discharging performed on the auxiliary battery is stopped at the eighth moment t8, where at the eighth moment t8, a difference between the voltage of the auxiliary battery at the eighth moment t8 and an average voltage of the batteries in the battery pack at the eighth moment t8 is not greater than a preset threshold.

With reference to the first aspect, the second implementation of the first aspect, the second aspect, the second implementation of the second aspect, the fourth aspect, or any implementation of the fourth aspect, in still another implementation of this embodiment of this application, the battery management unit may further determine, based on a voltage that is of each battery in the battery pack and that is measured in the first charging process, that the auxiliary battery is a battery corresponding to a maximum voltage value, determine that the target battery is any battery that has an internal short circuit in the battery pack, and determine that the reference battery is any battery other than the auxiliary battery and the target battery in the battery pack.

With reference to the first aspect, the second implementation of the first aspect, the second aspect, the second implementation of the second aspect, the fourth aspect, or any implementation of the fourth aspect, in still another implementation of this embodiment of this application, the battery management unit may further determine, based on a voltage that is of each battery in the battery pack and that is measured in the first charging process, that the auxiliary battery is a battery corresponding to a maximum voltage value, determine that the reference battery is a battery corresponding to a voltage that is greater than a first voltage threshold in the battery pack, and determine that the target battery is any one of batteries whose voltage values are less than the first voltage threshold in the battery pack. Optionally, the first voltage threshold may be an average value of measured voltages of the batteries in the battery pack.

With reference to the first aspect, any implementation of the first aspect, the second aspect, any implementation of the second aspect, the third aspect, any implementation of the third aspect, the fourth aspect, or any implementation of the fourth aspect, in still another possible implementation of this embodiment of this application, the battery management unit may further determine the first voltage $V_{set1}$ and/or the fourth voltage $V_{set2}$.

Optionally, the battery management unit may determine the first voltage $V_{set1}$ and/or the fourth voltage $V_{set2}$ based on an OCV-SOC curve of the battery, where the first voltage $V_{set1}$ and/or the fourth voltage $V_{set2}$ are/is within an approximately linear range in the OCV-SOC curve of the battery. It should be understood that the OCV-SOC curve of the battery may be known, or may be generated by the battery management unit based on a voltage of the battery measured in a historical charging process.

Optionally, a battery management system may determine a preset voltage range based on the voltage of the battery measured in the historical charging process. An OCV and an SOC of the battery are in an approximately linear relationship in the preset voltage range, and the first voltage $V_{set1}$ and/or the fourth voltage $V_{set2}$ fall/falls within the preset voltage range.

According to a fifth aspect, an embodiment of this application further provides a battery pack internal short circuit detection apparatus, including a measurement unit configured to measure voltages of a reference battery and a target battery in a first charging process of a battery pack, where a voltage value of the reference battery at a first moment t1 is a first voltage $V_{set1}$, a voltage value of the target battery at the first moment t1 is a second voltage V2(t1), and the battery pack includes the reference battery and the target battery, and measure voltages of the reference battery and the target battery in a second charging process of the battery pack, where a voltage value of the reference battery at a second moment t2 is the first voltage $V_{set1}$, and a voltage value of the target battery at the second moment t2 is a third voltage V2(t2), and a determining unit configured to determine, based on the second voltage V2(t1) and the third voltage V2(t2), whether the target battery has an internal short circuit.

It should be noted that for a specific implementation of the apparatus and units in the apparatus in the fifth aspect, refer to any implementation of the battery pack internal short circuit detection method in the first aspect. Details are not described herein again.

According to a sixth aspect, an embodiment of this application further provides a battery pack internal short circuit detection apparatus, including a memory and a processor, where the processor is configured to invoke a program and code that are stored in the memory to perform any battery pack internal short circuit detection method in the first aspect.

Optionally, the battery pack internal short circuit detection apparatus may further include a voltage collection module, a communications interface, a user interface, or the like. Details are not described herein again.

According to a seventh aspect, an embodiment of this application further provides a battery pack internal short circuit detection apparatus, including a measurement unit configured to measure terminal voltages of a reference battery and a target battery in a first charging process of a battery pack, where a voltage value of the target battery at a third moment t3 is a fourth voltage $V_{set2}$, a voltage value of the reference battery at the third moment t3 is a fifth voltage V1(t3), and the battery pack includes the reference battery and the target battery, and measure voltages of the reference battery and the target battery in a second charging process of the battery pack, where a voltage value of the target battery at a fourth moment t4 is the fourth voltage $V_{set2}$, and a voltage value of the reference battery at the fourth moment t4 is a sixth voltage V1(t4), and a determining unit configured to determine, based on the fifth voltage V1(t3) and the sixth voltage V1(t4), whether the target battery has an internal short circuit.

It should be noted that for a specific implementation of the apparatus and units in the apparatus in the seventh aspect, refer to any implementation of the battery pack internal short circuit detection method in the second aspect. Details are not described herein again.

According to an eighth aspect, an embodiment of this application further provides a battery pack internal short circuit detection apparatus, including a memory and a processor, where the processor is configured to invoke a program and code that are stored in the memory to perform any battery pack internal short circuit detection method in the second aspect.

Optionally, the battery pack internal short circuit detection apparatus may further include a voltage collection module, a communications interface, a user interface, or the like. Details are not described herein again.

According to a ninth aspect, an embodiment of this application further provides a battery pack internal short circuit detection apparatus, including a measurement unit configured to measure voltages of a reference battery and a target battery in a first charging process of a battery pack, where a voltage value of the reference battery at a first moment t1 is a first voltage $V_{set1}$, a voltage value of the target battery at the first moment t1 is a second voltage V2(t1), a voltage value of the target battery at the third moment t3 is a fourth voltage $V_{set2}$, a voltage value of the reference battery at the third moment t3 is a fifth voltage V1(t3), and the battery pack includes the reference battery and the target battery, a balanced discharging unit configured to perform balanced discharging on the reference battery from a fifth moment t5 to a sixth moment t6 by using a balancing circuit corresponding to the reference battery, and measure voltages of the reference battery from the fifth moment t5 to the sixth moment t6, where the fifth moment t5 is a moment after the third moment t3, and the measurement unit is further configured to measure voltages of the reference battery and the target battery in a second charging process of the battery pack, where a voltage value of the reference battery at a second moment t2 is the first voltage $V_{set1}$, a voltage value of the target battery at the second moment t2 is a third voltage V2(t2), a voltage value of the target battery at a fourth moment t4 is the fourth voltage $V_{set2}$, and a voltage value of the reference battery at the fourth moment t2 is a sixth voltage V1(t4), and a calculation unit configured to calculate an internal short circuit resistance of the target battery based on voltages of the reference battery in a balanced discharging process, the voltages of the target battery that are measured from the first moment t1 to the fourth moment t4, the fifth voltage V1(t3), and the sixth voltage V1(t4).

It should be noted that for a specific implementation of the apparatus and units in the apparatus in the ninth aspect, refer to any implementation of the battery pack internal short circuit detection method in the third aspect. Details are not described herein again.

According to a tenth aspect, an embodiment of this application further provides a battery pack internal short circuit detection apparatus, including a memory and a processor, where the processor is configured to invoke a program and code that are stored in the memory to perform any battery pack internal short circuit detection method in the third aspect.

Optionally, the battery pack internal short circuit detection apparatus may further include a voltage collection module, a communications interface, a user interface, or the like. Details are not described herein again.

According to an eleventh aspect, an embodiment of this application further provides a battery pack internal short circuit detection apparatus, including a measurement unit configured to measure voltages of a reference battery, a target battery, and an auxiliary battery in a first charging process of a battery pack, where a voltage value of the reference battery at a first moment t1 is a first voltage $V_{set1}$, a voltage value of the target battery at the first moment t1 is a second voltage V2(t1), a voltage value of the auxiliary battery at the first moment t1 is a seventh voltage V3(t1), and the battery pack includes the auxiliary battery, the target battery, and the reference battery, a balanced discharging unit configured to perform balanced discharging on the auxiliary battery from a seventh moment t7 to an eighth moment t8 by using a balancing circuit corresponding to the auxiliary battery, and measure voltages of the auxiliary battery from the seventh moment t7 to the eighth moment t8, where the seventh moment t7 is a moment after the first moment t1, and the measurement unit is further configured to measure voltages of the reference battery, the target battery, and the auxiliary battery in a second charging process of the battery pack, where a voltage value of the reference battery at a second moment t2 is the first voltage $V_{set1}$, a voltage value of the target battery at the second moment t2 is a third voltage V2(t2), and a voltage value of the auxiliary battery at the second moment t2 is an eighth voltage V3(t2), and a calculation unit configured to calculate an internal short circuit resistance of the target battery based on voltages of the auxiliary battery in a balanced discharging process, the voltages of the target battery that are measured from the first moment t1 to the second moment t2, the seventh voltage V3(t1), and the eighth voltage V3(t2).

It should be noted that for a specific implementation of the apparatus and units in the apparatus in the eleventh aspect, refer to any implementation of the battery pack internal short circuit detection method in the fourth aspect. Details are not described herein again.

According to a twelfth aspect, an embodiment of this application further provides a battery pack internal short circuit detection apparatus, including a memory and a processor, where the processor is configured to invoke a program and code that are stored in the memory to perform any battery pack internal short circuit detection method in the fourth aspect.

Optionally, the battery pack internal short circuit detection apparatus may further include a voltage collection module, a communications interface, a user interface, or the like. Details are not described herein again.

It should be understood that the battery pack internal short circuit detection apparatus according to any one of the fifth to the twelfth aspects may be an electric vehicle, an electronic device, or the like, or may be a battery management unit in an electric vehicle or an electronic device, or may be a vehicle control unit in an electric vehicle, or may be a module or chip independently disposed in an electric vehicle or an electronic device, or may be a server, a cloud, or the like. The electronic device may be a mobile phone, a tablet computer, a desktop computer, an AR/VR device, an onboard unit, or the like.

According to a thirteenth aspect, an embodiment of this application further provides a computer-readable medium. The computer-readable medium stores program code to be executed by a device, and the program code is used to perform the method according to any one of the first to the fourth aspects.

According to a fourteenth aspect, an embodiment of this application further provides a computer program product including an instruction. When the computer program product is run on a computer, the computer is enabled to perform the method according to any one of the first to the fourth aspects.

According to a fifteenth aspect, an embodiment of this application further provides a battery pack internal short circuit resistance detection system, including a battery pack formed by connecting a plurality of batteries in series, balancing circuits coupled respectively to the batteries in the battery pack, a memory, and a processor, where the memory is configured to store data and instructions, and the processor is configured to invoke the data and the instructions stored in the memory, to perform any battery pack internal short circuit resistance detection method according to the first aspect, the second aspect, the third aspect, or the fourth aspect.

According to a sixteenth aspect, an embodiment of this application further provides an electric vehicle, including any battery pack internal short circuit resistance detection system according to the ninth aspect.

According to a seventeenth aspect, an embodiment of this application further provides a chip, including a voltage collection module, a processor, and a memory, where the voltage collection module is configured to collect voltages of batteries in a battery pack, the memory is configured to store data and instructions, and the processor is configured to invoke the data and the instructions stored in the memory to perform any battery pack internal short circuit resistance detection method according to the first aspect, the second aspect, the third aspect, or the fourth aspect.

BRIEF DESCRIPTION OF DRAWINGS

To describe some of the technical solutions in the embodiments of this application more clearly, the following describes the accompanying drawings for describing the embodiments of this application.

FIG. 5A is a schematic flowchart of a first battery pack internal short circuit detection method according to an embodiment of this application;

FIG. 5B is a schematic diagram of a first battery pack internal short circuit detection principle according to an embodiment of this application;

FIG. 6A is a schematic flowchart of a second battery pack internal short circuit detection method according to an embodiment of this application;

FIG. 6B is a schematic diagram of a second battery pack internal short circuit detection principle according to an embodiment of this application;

FIG. 7A is a schematic flowchart of a third battery pack internal short circuit detection method according to an embodiment of this application;

FIG. 8A is a schematic flowchart of a fourth battery pack internal short circuit detection method according to an embodiment of this application;

DESCRIPTION OF EMBODIMENTS

In the embodiments of the specification, claims, and accompanying drawings of this application, the terms "first", "second", "third", and the like are intended to distinguish between similar objects but do not necessarily indicate a specific order or sequence. In addition, the terms "include", "have", and any variant thereof are intended to cover the non-exclusive inclusion, for example, include a series of steps or units. A method, system, product, or device is not necessarily limited to those steps or units that are clearly listed, but may include other steps or units that are not clearly listed or inherent to such a process, method, product, or device.

Figure 2:
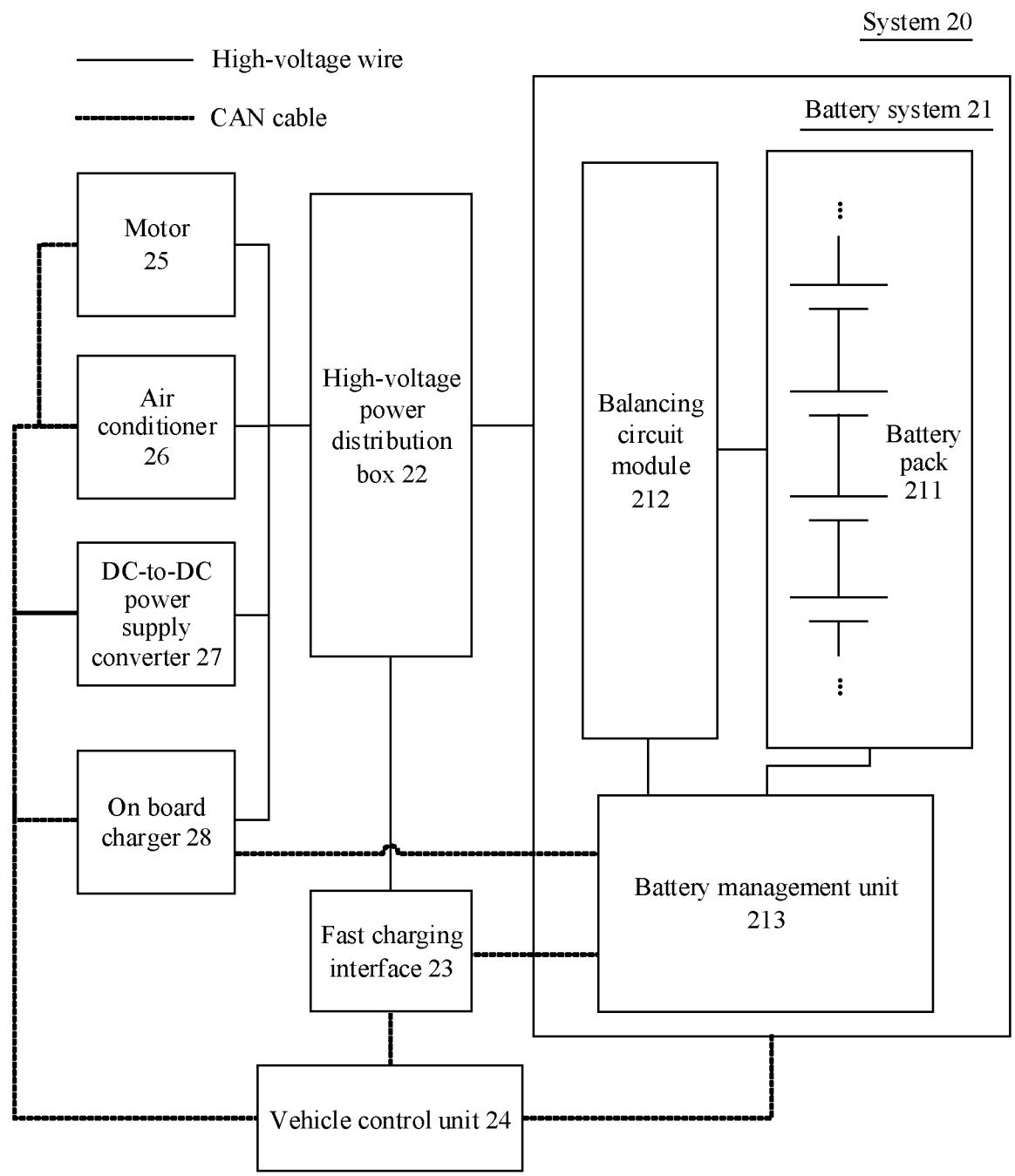
FIG. 2 is a schematic diagram of an architecture of a vehicle power system according to an embodiment of this application.

The following describes a vehicle power system 20 in the embodiments of this application with reference to FIG. 2. The system 20 may include a battery system 21, a high-voltage power distribution box 22, a fast charging interface 23, a vehicle control unit 24, energy-consuming components (for example, a motor 25 and an air conditioner 26), a direct-current power supply converter 27, an on board charger 28, and the like.

Figure 3:
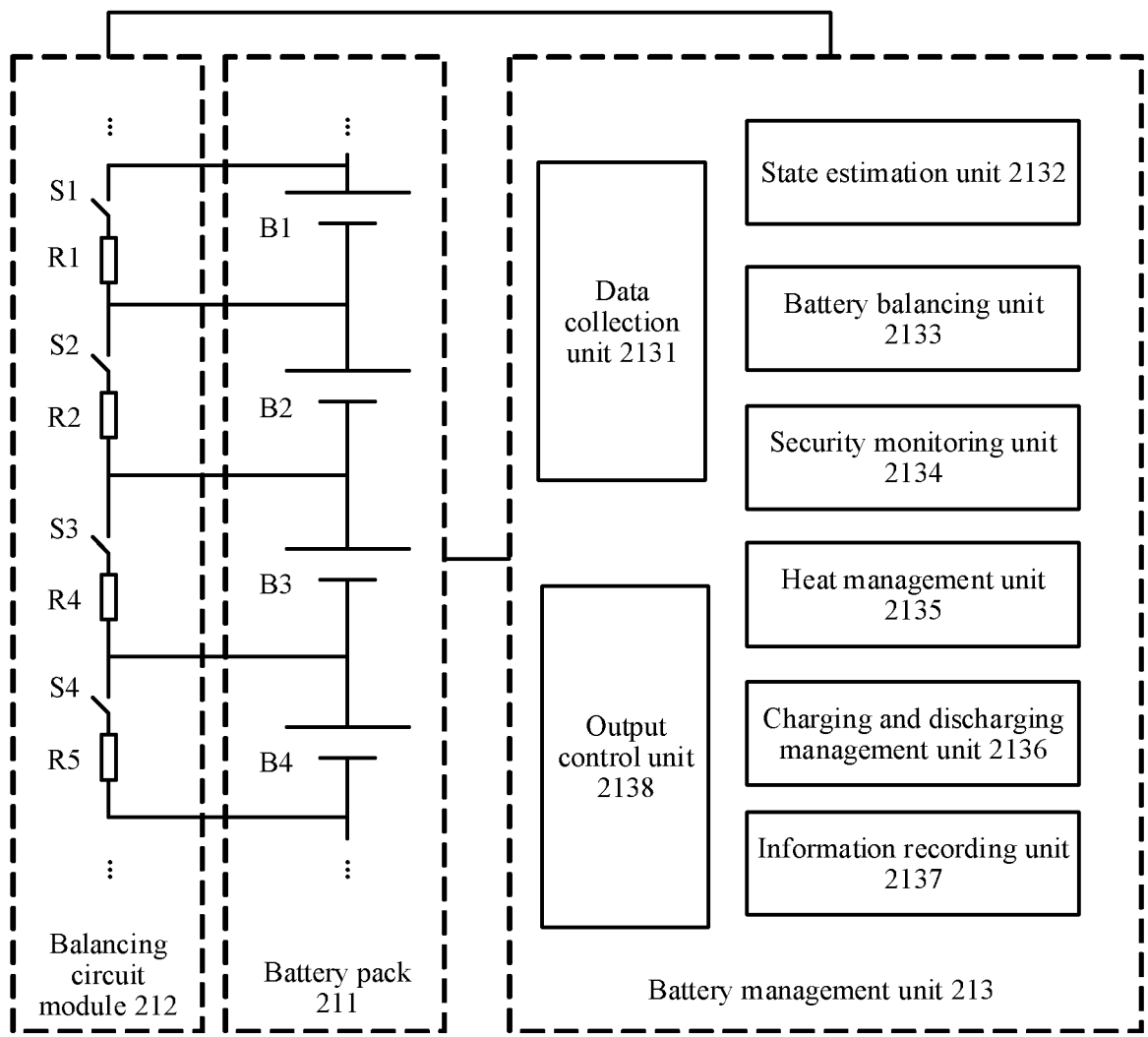
FIG. 3 is a schematic diagram of an architecture of a battery system according to an embodiment of this application.

FIG. 3 is an architectural diagram of the battery system (also referred to as a "battery pack internal short circuit resistance detection system" in the embodiments of this application). The battery system 21 may include a battery pack 211, a balancing circuit module 212 coupled to batteries in the battery pack 211, a battery management unit 213, and the like. The battery pack 211 includes a plurality of batteries, and the plurality of batteries may be connected in series, and the plurality of batteries may alternatively be connected in parallel first and then connected in series.

The balancing circuit module 212 is connected to the battery pack 211, is controlled by the battery management unit 213, and is configured to maintain consistency of voltages of the plurality of batteries connected in series. The balancing circuit module 212 may include balancing circuits that are in one-to-one correspondence with the batteries connected in series in the battery pack. A balancing circuit is configured to adjust a voltage of a battery corresponding to the balancing circuit. The balancing circuits may be of load consumption type balance, for example, for the balancing circuits shown in FIG. 3, each battery is connected in parallel with a resistor, and the resistor is connected in series with a switch. As shown in FIG. 3, a battery B1 is connected in parallel with a resistor R1, and a switch S1 controls the battery B1 to perform balanced discharging through a balancing circuit. Similarly, batteries B2, B3, and B4 are connected respectively in parallel with resistors R2, R3, and R4, and balancing circuits corresponding to the batteries are controlled respectively by switches S2, S3, and S4 to perform balanced discharging. When a voltage of a battery is excessively high, the battery management unit 213 controls a switch to be closed, so that a current is shunted by a resistor, and a current of a battery with a high voltage is small. It should be understood that the balancing circuits are implemented in the conventional technology, and the balancing circuits may further include another implementation. Details are not described in this embodiment of this application.

The battery management unit 213 may include at least one of a data collection unit 2131, a state estimation unit 2132, a battery balancing unit 2133, a security monitoring unit 2134, a heat management unit 2135, a charging and discharging management unit 2136, an information recording unit 2137, an output control unit 2138, and the like. The data collection unit 2131 is configured to collect data such as temperatures, voltages, and/or currents of the batteries in the battery pack 211. The state estimation unit 2131 is configured to estimate a battery status based on the data collected by the data collection unit, where the battery status may include a charging state, a discharging state, a high-temperature state, a low-temperature state, and the like. The battery balancing unit 2133 is configured to control the balancing circuit module 212. The security monitoring unit 2134 is configured to implement security monitoring on the battery pack 211, and may perform at least one of overvoltage monitoring, overcurrent monitoring, undervoltage monitoring, overtemperature monitoring, internal short circuit monitoring, and the like on the battery pack. The heat management unit 2135 is configured to adjust a temperature of the battery pack 211, and implement cooling and/or heating of the battery pack 211. The charging and discharging management unit 2136 is configured to charge/discharge the battery pack 211, and the like. The information recording unit is configured to store data generated during use of the battery pack 211. Functions of the foregoing units may be implemented by hardware or software. In the embodiments of this application, the battery management unit may implement internal short circuit monitoring, and may implement the battery pack internal short circuit detection method described in any one of the following Embodiments 1 to 4.

The battery management unit 213 may collect a voltage of each battery in the battery pack 211, and determine a reference battery, an auxiliary battery, and a target battery based on the voltage of each battery in the battery pack 211, where the reference battery is used as a reference and is a battery in which no internal short circuit occurs in the battery pack 211, the auxiliary battery is a battery in which no internal short circuit resistance occurs in the battery pack 211, and the auxiliary battery and the reference battery may be a same battery in one embodiment, and the target battery is a to-be-detected battery, and is a battery in which an internal short circuit may occur in the battery pack 211.

In the embodiments of the present application, the battery management unit 213 may check a voltage change of the target battery by using voltages of the reference battery in two charging processes as a reference, or may check a voltage change of the reference battery by using voltages of the target battery in two charging processes as a reference, and then, determine whether the target battery has an internal short circuit based on the voltage change. It may be understood that, when the voltages of the reference battery in the two charging processes are used as a reference, if the voltage change of the target battery corresponding to that the reference battery has a same voltage value in the two charging processes is greater than a preset threshold, it may be considered that the target battery has an internal short circuit. For a specific implementation, refer to related descriptions in Embodiment 1 or Embodiment 2. Details are not described in this embodiment of this application.

In the embodiments of the present application, the battery management unit 213 may perform balanced discharging on the auxiliary battery between the two charging processes, calculate an internal short circuit resistance of the target battery based on voltages of the auxiliary battery in the two charging processes, voltages of the auxiliary battery in a balanced discharging process, and voltages of the target battery and the auxiliary battery in the two charging processes, and implement alarming at different levels for a battery internal short circuit based on the calculated internal short circuit resistance. For a specific implementation, refer to related descriptions in Embodiment 3 or Embodiment 4. Details are not described in this embodiment of this application.

In the embodiments of the present application, "a voltage of a battery" refers to "a terminal voltage of the battery", namely, a difference between a positive voltage and a negative voltage of the battery, or an output voltage of the battery.

The battery system 21 provides, by using the high-voltage power distribution box 22, a driving force for energy-consuming components such as the motor 25 and the air conditioner 26, or may convert, by using the power supply converter 27, a high-voltage direct-current power supply provided by the battery system 21 into a low-voltage direct-current power supply that can supply power to components such as the vehicle control unit 24 in the vehicle. The power supply converter 27 is usually a direct current (DC)-to-DC power supply converter (DC-to-DC converter), and is configured to convert a high-voltage direct-current power supply into a low-voltage direct-current power supply, for example, a power supply of 12 volts (V), 5 V, or another voltage value.

The vehicle control unit 24 is configured to control the vehicle and components. The vehicle control unit may include at least one processor. The processor executes an instruction stored in a non-transient computer-readable medium such as a data storage apparatus. A computer system may alternatively be a plurality of computing devices that control individual components or subsystems of the vehicle in a distributed manner. The processor may be any conventional processor, for example, a commercially available central processing unit (CPU). Optionally, the processor may be a dedicated device such as an application-specific integrated circuit (ASIC) or another hardware-based processor. The vehicle control unit 24 may exchange information with a motor controller, the battery management unit, a charging system, a braking system, a cooling system, and the like by using a Controller Area Network (CAN bus). The vehicle control unit 24 may further include a user interface, to implement human-machine interaction with a user of the vehicle.

For example, the vehicle control unit may send an instruction to the motor controller, and the instruction may include motor power information, motor mode information, or another parameter that is used to control the motor, so that the motor controller controls the motor according to the instruction.

For another example, the vehicle control unit exchanges information with a battery management system by using the CAN bus. The vehicle control unit may send an instruction to the battery management system. The instruction may be a charging instruction, a discharging instruction, another instruction, or the like. The battery management system may obtain parameters such as a voltage, a current, and a temperature of a battery, and an SOC of the battery pack, and report the parameters to the vehicle control unit. In another embodiment of this application, a part of or the entire of the battery management unit may be a part of the vehicle control unit, that is, some or all functions of the battery management unit may also be implemented by the vehicle control unit.

The on board charger 28 is configured to convert alternating current into DC, to charge the battery pack in the vehicle. An input of the fast charging interface 23 is DC, and the battery pack of the vehicle can be directly charged.

The energy-consuming components (for example, the motor 25 and the air conditioner 26) are driven by electric power provided by the battery pack, to dissipate energy. For example, the motor may be controlled by the motor controller to drive the vehicle.

It should be understood that the system 20 may further include a peripheral device, for example, a radar, a sensor, or a laser rangefinder. The peripheral device may be communicatively connected to the vehicle control unit by using the CAN bus. The system 20 may further include another peripheral device. This is not limited.

It should be understood that the vehicle may be a pure electric vehicle, a hybrid vehicle, or another vehicle including an electric vehicle. This is not limited.

It should be further understood that the system 20 is merely an implementation scenario in this embodiment of this application. This embodiment of this application is further applicable to another system including the battery pack and the battery management unit that are described above. The system may be used in a device, for example, a mobile phone, a tablet computer, a personal computer, a wearable device, or a mobile power pack. This is not limited.

Figure 4:
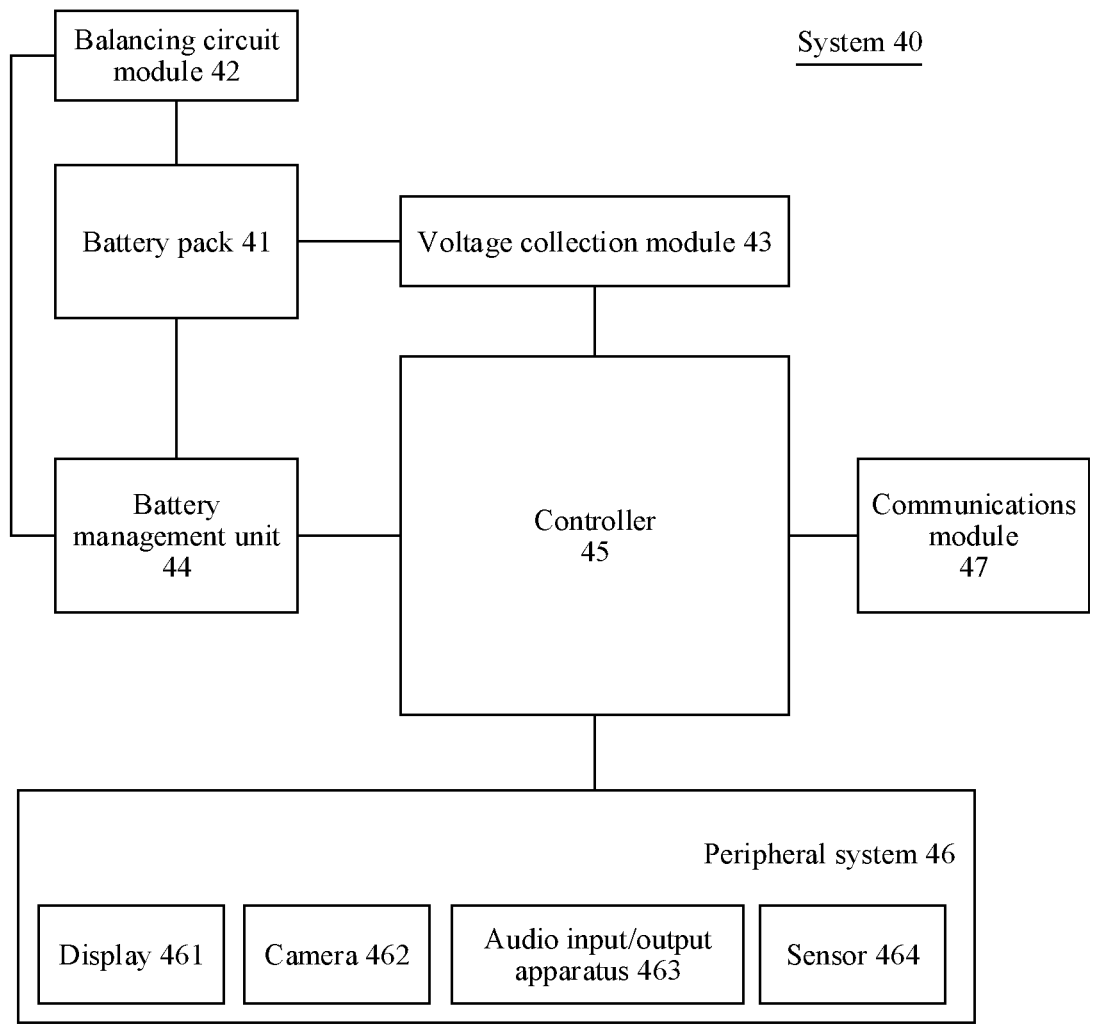
FIG. 4 is a schematic diagram of an architecture of a battery pack internal short circuit detection system according to an embodiment of this application.

Refer to FIG. 4, an architectural diagram of a battery pack internal short circuit detection system. The system 40 may include a battery pack 41, a balancing circuit module 42, a voltage collection module 433, a battery management unit 44, and a controller 45. For the battery pack 41 and the balancing circuit module 42, refer to related descriptions of the battery pack 211 and the balancing circuit module 212 in the system 20 shown in FIG. 2. Details are not described herein again. The voltage collection module 43 is coupled to the battery pack 41, and is configured to collect a voltage of each battery in the battery pack 41.

The battery management unit 44 is configured to implement some or all of the functions of the data collection unit 2131, the state estimation unit 2132, the battery balancing unit 2133, the security monitoring unit 2134, the heat management unit 2135, the charging and discharging management unit 2136, the information recording unit 2137, the output control unit 2138, and the like in FIG. 2.

The controller 45 is a control center of the system 40, and may include elements such as a processor and a memory. The processor may be used as the control center of the system 40, and is configured to implement various functions of the system 40, for example, implement all or some of the methods described in any one of the following Embodiments 1 to 4.

In another embodiment of this application, the battery management unit 44 may include a memory and a processor, or the battery management unit 44 may implement all or some of the methods described in any one of the following Embodiments 1 to 4. Alternatively, all or some of the methods described in any one of the following Embodiments 1 to 4 may be implemented by using a chip independently disposed in the system. This is not limited in this embodiment of this application.

The system 40 may further include a peripheral system 46. The peripheral system 46 is mainly configured to implement an interaction function between the controller 45 and a user/an external environment, and may include an input/output apparatus. In a specific implementation, the peripheral system 46 may include a display 461, a camera 462, an audio input/output (I/O) apparatus 463, and a sensor 464. It should be noted that the peripheral system 45 may further include another I/O peripheral device. The audio input/output apparatus 463 may include an audio input or output element, for example, a loudspeaker or a microphone. The display 461 may include a display panel, a touch panel, and the like. The sensor 461 may include a temperature sensor, a gyroscope, an accelerometer, a camera, an infrared sensor, and the like. The loudspeaker and the display may be configured to output prompt information in this embodiment of this application. The gyroscope, the accelerometer, the camera, and the like may obtain motion information of a device (for example, a vehicle or a terminal) in which the system is located, to identify a motion state and the like of the device.

Optionally, the system may further include a communications module 47 to implement information exchange with another device (for example, a mobile phone or another terminal). The communications module 47 may include a radio frequency module, a BLUETOOTH module, a WI-FI module, a communications interface, and the like. The radio frequency module is configured to receive and send radio frequency signals to communicate with a communications network and other communications devices, and mainly integrates a receiver and a transmitter.

Optionally, the battery management unit 44 and/or the vehicle control unit 45 may share a processor and/or a memory. This is not limited in this embodiment of this application.

The memory includes but is not limited to a random-access memory (RAM), a read-only memory (ROM), an erasable programmable ROM (EPROM), or a portable ROM (e.g., compact disc (CD) ROM (CD-ROM)). The memory 432 is configured to store related program instructions and related data.

The processor may be a CPU, the processor 431 may further be another general-purpose processor, a digital signal processor (DSP), an ASIC, a field-programmable gate array (FPGA) or another programmable logic device, a discrete gate or transistor logic device, a discrete hardware component, or the like. The general-purpose processor may be a microprocessor, or the processor may be any conventional processor or the like.

The following describes method embodiments provided in this application.

Embodiment 1

With reference to a schematic flowchart of a battery pack internal short circuit detection method shown in FIG. 5A and a schematic diagram of a battery pack internal short circuit detection principle shown in FIG. 5B, the following describes a first battery pack internal short circuit detection method according to this embodiment of this application. The method may be performed by the battery management unit 213 shown in FIG. 2 and a battery pack internal short circuit detection apparatus, and may be performed by a security monitoring unit or a processor in the battery management unit 213. The battery management unit is used as an example for description in this embodiment of this application. It should be understood that the method may be further applied to another controller, for example, a vehicle control unit. This is not limited. An internal short circuit of a battery in a battery pack may be identified by using the method, and the method may include some or all of the following steps.

S52: Measure voltages of a reference battery and a target battery in a first charging process of a battery pack, where a voltage value of the reference battery at a first moment t1 is a first voltage, a voltage value of the target battery at the first moment t1 is a second voltage $V2(t1)$, and the battery pack includes the reference battery and the target battery.

In a specific implementation, the first voltage may be a preset voltage value $V_{set1}$, and the battery management unit may detect the voltage of the reference battery in the first charging process, and when detecting that the voltage of the reference battery is $V_{set1}$, obtain the voltage, namely the second voltage $V2(t1)$, of the target battery.

In another specific implementation, the battery management unit may determine a voltage range that enables an OCV-SOC curve of the reference battery to be approximately linear. The first voltage $V_{set1}$ may be any voltage value that is among detected voltages of the reference battery and that falls within the voltage range.

Figure 5C:
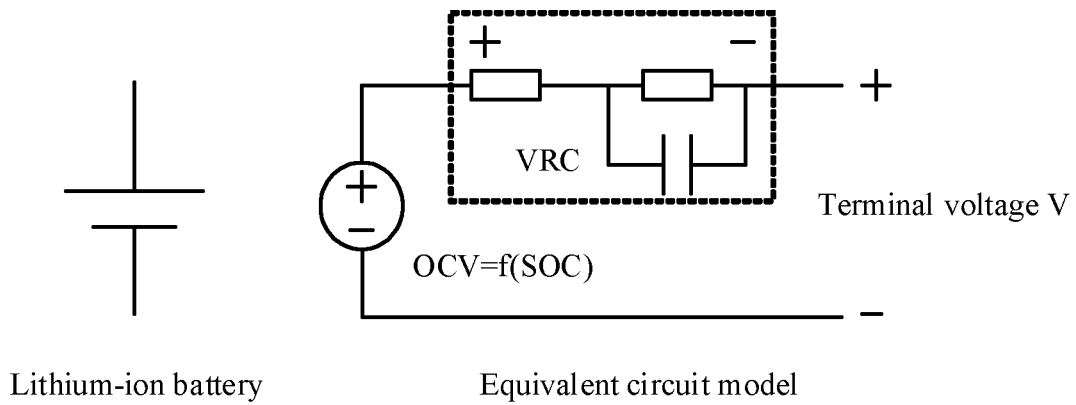
FIG. 5C is a schematic diagram of a circuit of an equivalent circuit model according to an embodiment of this application.
Figure 5D:
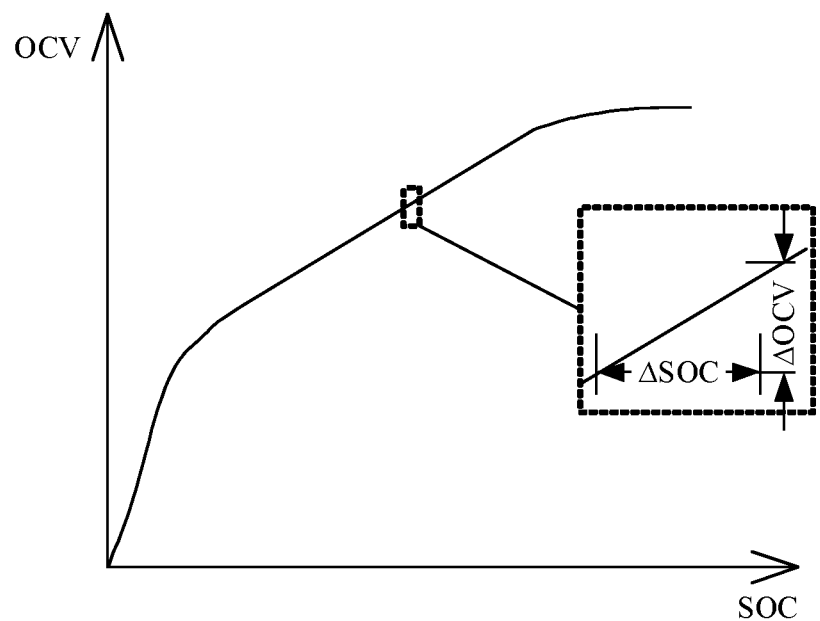
FIG. 5D is a schematic diagram of an OCV-SOC curve of a battery according to an embodiment of this application.

It should be understood that the battery may be approximated by using an equivalent circuit model shown in FIG. 5C, and a terminal voltage V of the battery is equal to an OCV of the battery minus a voltage drop VRC on a battery impedance. The OCV of the battery has a fixed relationship with an SOC of the battery and the fixed relationship basically remains unchanged during a battery aging cycle. The voltage drop VRC on the battery impedance is related to the battery impedance and a current i. In the OCV-SOC curve of the battery shown in FIG. 5D, when the SOC of the battery is at a medium level, for example, when the SOC of the battery is between 40% and 70%, a relationship between the OCV and the SOC is approximately linear. In this case, at a determined SOC point, a change of the OCV may be approximately equal to the product of a change of the SOC and a coefficient $\alpha$, that is, $\Delta OCV = \alpha \times \Delta SOC$.

Optionally, a battery management system may determine a voltage range based on a voltage of the battery measured in a historical charging process, the OCV of the battery and the SOC in the voltage range are in an approximate linear relationship, and the first voltage $V_{set1}$ falls within the preset voltage range. Alternatively, the battery management unit may determine the first voltage $V_{set1}$ based on the OCV-SOC curve of the battery, where the first voltage $V_{set1}$ is within an approximately linear range in the OCV-SOC curve of the battery. The OCV-SOC curve of the battery may be known, or may be generated by the battery management unit based on the voltage of the battery measured in the historical charging process.

It should be understood that, in the embodiments of this application, a voltage of a battery (the target battery, the reference battery, the auxiliary battery, or the like) refers to a terminal voltage, namely, a voltage at two ends of the battery, and is equal to a difference between an OCV of the battery and a voltage drop on an internal resistance of the battery.

The reference battery may be considered as a battery in which no internal short circuit exists. It should be understood that voltage-time curves detected in two charging processes of a battery in which no internal short circuit resistance exists are theoretically consistent. The target battery is a battery that may have an internal short circuit in the battery pack. An objective of this embodiment of this application is to sequentially detect, by using the reference battery as a reference, whether the target battery has an internal short circuit.

Optionally, the battery management unit may further determine the reference battery, the target battery, an auxiliary battery, and the like based on a voltage that is of each battery in the battery pack and that is measured in the first charging process. The following describes two implementations of determining the reference battery, the target battery, and the auxiliary battery.

Implementation 1:

Based on the voltage that is of each battery in the battery pack and that is measured at a specific moment in the first charging process, the battery management unit may further determine that the reference battery is a battery corresponding to a maximum terminal voltage value, and determine that the target battery is any battery other than the reference battery in the battery pack. In this case, the battery management unit may use the battery corresponding to the maximum terminal voltage, namely, the reference battery, as a reference, and consider that the reference battery does not have an internal short circuit. A voltage change of another battery, namely, the target battery, in a battery pack when the reference battery is in a same state (namely, a same voltage) in different charging processes is detected, to qualitatively identify whether the target battery has an internal short circuit.

It should be understood that, when the auxiliary battery is needed, it may be determined that the auxiliary battery is a battery corresponding to a second maximum terminal voltage value, or it may be determined that the auxiliary battery is any one of batteries whose voltage values are greater than a first voltage threshold in the battery pack. The auxiliary battery and the reference battery may also be interchangeable or may be a same battery.

Implementation 2:

Based on the voltage that is of each battery in the battery pack and that is measured at a specific moment in the first charging process, the battery management unit may determine that the reference battery is any one of the batteries whose voltage values are greater than the first voltage threshold in the battery pack, and determine that the target battery is any one of batteries whose voltage values are less than the first voltage threshold in the battery pack. Optionally, the first voltage threshold may be an average value of measured voltages of the batteries in the battery pack. In this case, the battery management unit may use a battery corresponding to a terminal voltage that is greater than an average terminal voltage of the battery pack, namely, the reference battery, as a reference, and consider that the reference battery does not have an internal short circuit. A voltage change of another battery, namely, the target battery, in a battery pack when the reference battery is in a same state (namely, a same voltage) in different charging processes is detected, to qualitatively identify whether the target battery has an internal short circuit.

It should be understood that, when the auxiliary battery is needed, it may be determined that the auxiliary battery is any one of the batteries whose voltage values are greater than the first voltage threshold in the battery pack, or it may be determined that the auxiliary battery is a battery corresponding to a maximum voltage value, or it may be determined that the auxiliary battery is a battery corresponding to a second maximum voltage value.

It should be noted that there may be another implementation of determining the reference battery, the target battery, or the auxiliary battery, and details are not described herein again. For example, the reference battery and the target battery are any two batteries in the battery pack, and the voltage of the reference battery may be greater than the voltage of the target battery.

S54: Measure voltages of the reference battery and the target battery in a second charging process of the battery pack, where a voltage value of the reference battery at a second moment t2 is the first voltage $V_{set1}$, and a voltage value of the target battery at the second moment t2 is a third voltage V2(t2).

It should be understood that at least one charging and/or discharging process may be performed between the first charging process and the second charging process, or balanced discharging may be performed on any one or more batteries in the battery pack. This is not limited.

In a specific implementation of this application, the battery management unit may detect the voltage of the reference battery in the second charging process, and when detecting that the voltage of the reference battery is $V_{set1}$, obtain the voltage, namely, the third voltage $V2(t2)$, of the target battery.

S56: Determine, based on the second voltage $V2(t1)$ and the third voltage $V2(t2)$, whether the target battery has an internal short circuit.

It should be understood that if the target battery has an internal short circuit, as a quantity of charging times increases, and battery usage duration increases, an internal short circuit phenomenon of the target battery becomes more obvious, an internal short circuit resistance of the target battery becomes smaller, and the target battery consumes more energy by using the internal short circuit. In this case, a terminal voltage of the target battery decreases continuously. An implementation of determining whether the target battery has an internal short circuit may be as follows. If the battery management system determines that a difference between the second voltage $V2(t1)$ and the third voltage $V2(t2)$ is greater than a preset threshold, the target battery has an internal short circuit. Otherwise, the target battery does not have an internal short circuit.

It should be further understood that there may be another implementation of determining whether the target battery has an internal short circuit. For example, the battery management unit determines whether an average value of voltage changes of the target battery in the first charging process and the second charging process is greater than a preset threshold, and if yes, determines that the target battery has an internal short circuit. Otherwise, the target battery does not have an internal short circuit.

Embodiment 2

In Embodiment 1, a voltage change of the target battery is checked by using the voltages of the reference battery in the two charging processes as a reference, and whether the target battery has an internal short circuit is determined based on the voltage change of the target battery. Similarly, in Embodiment 2, a voltage change of the reference battery is checked by using the voltages of the target battery in the two charging processes as a reference, and then, whether the target battery has an internal short circuit is determined based on the voltage change of the reference battery.

With reference to a schematic flowchart of a battery pack internal short circuit detection method shown in FIG. 6A and a schematic diagram of a battery pack internal short circuit detection principle shown in FIG. 6B, the following describes a second battery pack internal short circuit detection method according to this embodiment of this application. The method may be performed by the battery management unit 213 shown in FIG. 2, and may be performed by a security monitoring unit or a processor in the battery management unit 213. The battery management unit is used as an example for description in this embodiment of this application. It should be understood that the method may be further applied to another controller, for example, a vehicle control unit. This is not limited. An internal short circuit of a battery in a battery pack may be identified by using the method, and the method may include some or all of the following steps.

S62: Measure terminal voltages of a reference battery and a target battery in a first charging process of a battery pack, where a voltage value of the reference battery at a third moment t3 is a fifth voltage $V1(t3)$, a voltage value of the target battery at the third moment t3 is a fourth voltage $V_{set2}$, and the battery pack includes the reference battery and the target battery.

In a specific implementation, the fourth voltage may be a preset voltage value $V_{set2}$, and the battery management unit may detect the voltage of the target battery in the first charging process, and when detecting that the voltage of the target battery is $V_{set2}$, obtain the voltage, namely, the fifth voltage $V1(t3)$, of the reference battery.

In another specific implementation, the battery management unit may determine a voltage range that enables an OCV-SOC curve of the target battery to be approximately linear. $V_{set2}$ may be any voltage value that is in detected voltages of the target battery and that falls within the voltage range.

A principle of a method for determining the voltage range and the OCV-SOC curve of the target battery is the same as that of the method for determining the voltage range and the OCV-SOC curve of the reference battery in Embodiment 1. For details, refer to related descriptions in Embodiment 1. Details are not described herein again.

For determining the reference battery and the target battery, refer to related descriptions in the two implementations of determining the reference battery, the target battery, and the auxiliary battery in Embodiment 1. Details are not described herein again.

S64: Measure voltages of the reference battery and the target battery in a second charging process of the battery pack, where a voltage value of the target battery at a fourth moment t4 is the fourth voltage $V_{set2}$, and a voltage value of the reference battery at the fourth moment t4 is a sixth voltage $V1(t4)$.

In a specific implementation of this application, the battery management unit may detect the voltage of the target battery in the second charging process, and when detecting that the voltage of the reference battery is $V_{set2}$, obtain the voltage, namely, the sixth voltage $V1(t4)$, of the reference battery.

S66: Determine, based on the fifth voltage $V1(t3)$ and the sixth voltage $V1(t4)$, whether the target battery has an internal short circuit.

It should be understood that if the target battery has an internal short circuit, as a quantity of charging times increases, and battery usage duration increases, an internal short circuit phenomenon of the target battery becomes more obvious, an internal short circuit resistance of the target battery becomes smaller, and the target battery consumes more energy by using the internal short circuit. In this case, a terminal voltage of the target battery decreases continuously. In this case, if the target battery in which an internal short circuit exists is used as a reference, the fifth voltage $V1(t3)$, of the reference battery, detected in a prior charging process is different from the sixth voltage $V1(t4)$ detected in a latter charging process.

An implementation of determining whether the target battery has an internal short circuit may be as follows. If the battery management system determines that a difference between the fifth voltage $V1(t3)$ and the sixth voltage $V1(t4)$ is greater than a preset threshold, the target battery has an internal short circuit. Otherwise, the target battery does not have an internal short circuit.

It should be noted that Embodiment 1 and Embodiment 2 describe an implementation method for qualitatively determining whether an internal short circuit occurs in a battery of the battery pack. When the battery management unit determines that a battery with an internal short circuit exists in the battery pack, the battery management unit may report, to a vehicle controller, indication information used to indicate that a battery with an internal short circuit exists in the battery pack, after the vehicle controller receives the indication information, if a vehicle is in a running state, a display apparatus or a loudspeaker may output prompt information used to prompt a user that a battery is faulty or that an internal short circuit occurs in a battery, for example, the prompt information is displayed on a vehicle instrument screen, and if the vehicle is in a charging state, prompt information used to prompt the user that a battery is faulty or that an internal short circuit occurs in a battery is sent to a terminal, for example, a mobile phone, bound to the vehicle, and in this case, the vehicle controller may stop charging the battery.

In another implementation of this application, when an internal short circuit occurs in the target battery, an internal short circuit resistance of the target battery may be further calculated. For example, the internal short circuit resistance of the target battery may be further calculated by using methods, described in the following Embodiment 3 and Embodiment 4, for calculating the internal short circuit resistance of the target battery or by using another method for calculating an internal short circuit resistance of a battery in the conventional technology. For details, refer to related descriptions in Embodiment 3 or Embodiment 4. Details are not described herein again.

For the foregoing Embodiment 1 or Embodiment 2, in an implementation scenario of this embodiment of the present application, the battery management system may further perform alarming at different levels based on a voltage change or an internal short circuit resistance of a battery in the two charging processes. The voltage change of the battery refers to a difference between the second voltage $V2(t1)$ and the third voltage $V2(t2)$ in Embodiment 1, and refers to a difference between the fifth voltage $V1(t3)$ and the sixth voltage $V1(t4)$ in Embodiment 2.

A specific implementation of performing alarming at different levels based on the voltage change of the battery is shown in Table 1:

TABLE 1

| Voltage difference of the battery | Vehicle state | Processing manner |
|---|---|---|
| <a preset threshold | Running state | Output prompt information |
| | Charging state | Output prompt information |
| >a preset threshold | Running state | Output prompt information |
| | Charging state | Stop charging and output prompt information |

The preset threshold is greater than $V_{set1}$ or greater than $V_{set2}$. It should be understood that the battery management system may alternatively use another manner of processing at different levels. This is not limited.

A specific implementation of performing processing at different levels based on the internal short circuit resistance of the battery is shown in Table 2:

TABLE 2

| Internal short circuit resistance of the battery | Vehicle state | Processing manner |
|---|---|---|
| <a preset resistance value | Running state | Output prompt information |
| | Charging state | Output prompt information |
| >a preset resistance value | Running state | Output prompt information |
| | Charging state | Stop charging and output prompt information |

The preset resistance value may be a fixed value, or may be determined based on a smallest internal short circuit resistance in all internal short circuit resistances of the target battery, or may be determined based on an average value of all internal short circuit resistances of the target battery, or may be determined in another manner. This is not limited.

Embodiment 3

Figure 7B:
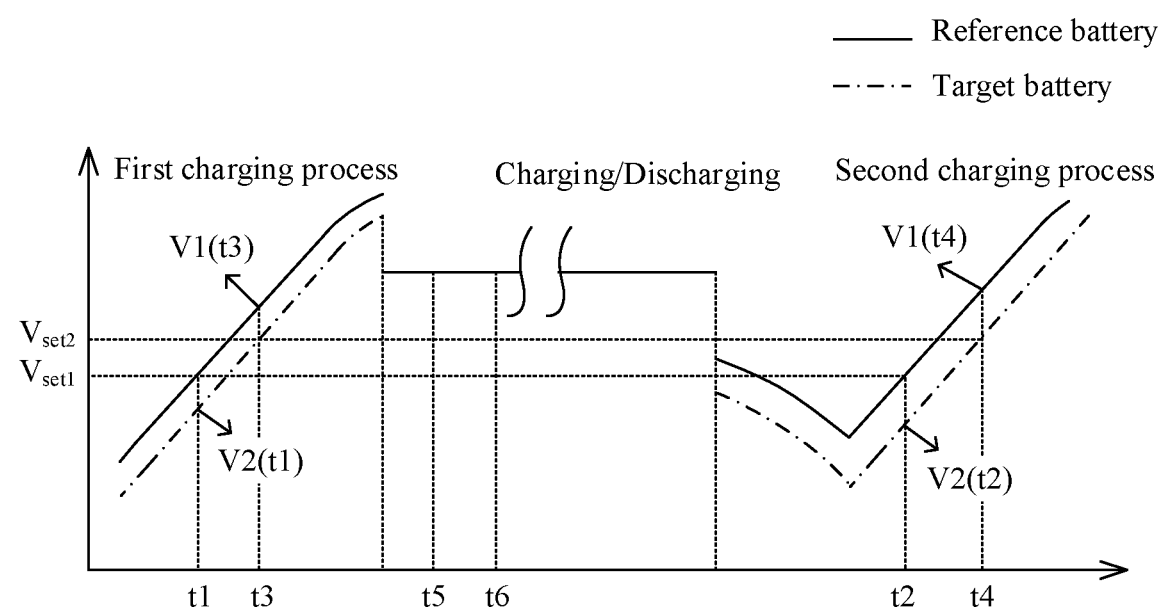
FIG. 7B is a schematic diagram of a battery internal short circuit resistance calculation principle according to an embodiment of this application.

With reference to a schematic flowchart of a battery pack internal short circuit detection method shown in FIG. 7A and a schematic diagram of a battery internal short circuit resistance calculation principle shown in FIG. 7B, the following describes a battery pack internal short circuit detection method according to this embodiment of this application. The method may be performed by the battery management unit 213 shown in FIG. 2, and may be performed by a security monitoring unit 2135 or a processor in the battery management unit 213. The battery management unit is used as an example for description in this embodiment of this application. It should be understood that the method may be further applied to another controller, for example, a vehicle control unit. This is not limited. An internal short circuit resistance of a battery may be quantitatively calculated by using the method, and the method may include some or all of the following steps.

S72: Measure voltages of a reference battery and a target battery in a first charging process of a battery pack, where a voltage value of the reference battery at a first moment t1 is a first voltage $V_{set1}$, a voltage value of the target battery at the first moment t1 is a second voltage $V2(t1)$, a voltage value of the target battery at a third moment t2 is a fourth voltage $V_{set2}$, a voltage value of the reference battery at the third moment t3 is a fifth voltage $V1(t3)$, the battery pack includes the reference battery and the target battery, the voltage of the reference battery is greater than the voltage of the target battery, and the third moment t3 is a moment after the first moment t1.

In Embodiment 3, the reference battery is also referred to as an auxiliary battery, and the reference battery and the auxiliary battery are a same battery.

In an implementation of this application, the target battery may be a battery that has an internal short circuit and that is detected by using the methods in Embodiment 1 and Embodiment 2, or may be a battery that has an internal short circuit and that is determined by using a method for qualitatively identifying a battery internal short circuit in the conventional technology. The battery management unit determines, based on a voltage that is of each battery in the battery pack and that is measured in the first charging process, that the reference is a battery corresponding to a maximum voltage value or a battery corresponding to a voltage value greater than a first voltage threshold. In this case, the battery management unit may perform alarming at different levels based on an internal short circuit resistance of the target battery. For a specific implementation, refer to the implementation of the alarming at different levels described in Table 2. Details are not described herein again.

In another implementation of this application, the battery management unit may further determine the reference battery, the target battery, and the like based on a voltage that is of each battery in the battery pack and that is measured in the first charging process. For a method for determining the reference battery and the target battery from the battery pack, refer to related descriptions in Embodiment 1. Details are not described herein again. In this case, the battery management unit may determine, based on the internal short circuit resistance of the target battery, whether the target battery has an internal short circuit, and/or perform alarming at different levels based on a calculated internal short circuit resistance. For example, when the internal short circuit resistance of the target battery is less than a first resistance value, the target battery is identified to have an internal short circuit.

In a specific implementation, the first voltage may be a preset voltage value $V_{set1}$, the fourth voltage may be a preset voltage value $V_{set2}$, and the battery management unit may detect the voltage of the reference battery and the voltage of the target battery in real time in the first charging process, determine the voltage, namely, the second voltage $V2(t1)$, of the target battery when the voltage of the reference battery is $V_{set1}$, and determine the voltage, namely, the fifth voltage $V1(t3)$, of the reference battery when the voltage of the target battery is $V_{set2}$.

Similar to Embodiment 1, $V_{set1}$ and/or $V_{set2}$ are/is within an approximately linear range in an OCV-SOC curve of a battery. For details, refer to related descriptions in Embodiment 1. Details are not described herein again. It should be understood that, when the $V_{set1}$ and/or $V_{set2}$ are/is within the approximately linear range, a change of an OCV and a change of an SOC meet $\Delta SOC = \alpha \times \Delta OCV$, and the coefficient $\alpha$ may be a constant. During subsequent calculation, the coefficient $\alpha$ may be eliminated by a division method, that is, $\Delta SOC1/\Delta SOC2 = \Delta OCV1/\Delta OCV2$. If the OCV and the SOC are in a non-linear relationship, that is, $\Delta SOC = f(\Delta OCV)$, $\Delta SOC1/\Delta SOC2 = f(\Delta OCV1)/f(\Delta OCV2)$, which results in a strong dependence of a result on a specific form of a function f, thereby introducing more unknowns to be solved. It may be understood that, because absolute linearity in engineering is difficult to obtain, within an acceptable range, approximate linearity is acceptable, and an acceptable degree of approximation depends on a degree of tolerance of a result error by a system.

S74: Perform balanced discharging on the reference battery from a fifth moment t5 to a sixth moment t6 by using a balancing circuit corresponding to the reference battery, and measure voltages of the reference battery from the fifth moment t5 to the sixth moment t6, where the fifth moment t5 is a moment after the third moment t3.

The fifth moment t5 is a moment after the third moment t3, and the sixth moment t6 is a moment before the second moment t2. As shown in FIG. 3, from the fifth moment t5 to the sixth moment t6, the battery management unit may control a switch S1 in the balancing circuit corresponding to the reference battery (for example, a battery B1) to be closed, and conduct a path formed by the reference battery B1 and a resistor R1 in the balancing circuit. The resistor R1 consumes the energy of the reference battery B1 and monitors the voltage of each battery in the resistor pack in real time. If a difference between a voltage $V1(t)$ of the reference battery B1 and an average voltage Vavg(t) of the battery pack is not greater than a first preset threshold $V_{set3}$ (at the sixth moment t6), the switch S1 in the balancing circuit corresponding to the reference battery B1 is opened, to complete balanced discharging of the reference battery B1.

The sixth moment t6 is a time point at which a formula $|V1(t) - Vavg(t)| \leq V_{set3}$ is established, where time t is a variable, and $V_{set3}$ is a threshold preset by a battery management system, is determined by consistency of batteries in the battery pack, and usually may have a value ranging from 10 mV to 20 mV. The sixth moment t6 may alternatively be a moment at which a difference between the voltage of the reference battery and the voltage of the target battery is not greater than a second preset threshold $V_{set4}$, or the sixth moment t6 is determined in another manner. This is not limited.

In a time period from t5 to t6, lost power of the reference battery due to balance discharging may be expressed as $$\int_{t5}^{t6} \frac{V1(t)}{R1} dt.$$

It should be noted that the fifth moment t5 and the sixth moment t6 each may be any moment after the third time t3 and before the second moment t2, and the battery pack may be in a charging or discharging state at the fifth moment t5 and the sixth moment t6.

S76: Measure voltages of the reference battery and the target battery in a second charging process of the battery pack, where a voltage value of the reference battery at the second moment t2 is the first voltage $V_{set1}$, a voltage value of the target battery at the second moment t2 is a third voltage $V2(t2)$, a voltage value of the target battery at a fourth moment t4 is the fourth voltage $V_{set2}$, and a voltage value of the reference battery at the fourth moment t2 is a sixth voltage $V1(t4)$.

In a specific implementation, the battery management unit may detect the voltage of the reference battery and the voltage of the target battery in real time in the second charging process, determine the voltage, namely, the third voltage $V2(t2)$, of the target battery when the voltage of the reference battery is $V_{set1}$, and determine the voltage, namely, the sixth voltage $V1(t4)$, of the reference battery when the voltage of the target battery is $V_{set2}$.

S78: Calculate an internal short circuit resistance of the target battery based on the voltages of the reference battery in the balanced discharging process, the voltages of the target battery that are measured from the first moment t1 to the fourth moment t4, the fifth voltage $V1(t3)$, and the sixth voltage $V1(t4)$.

In an implementation of this embodiment of this application, a calculation formula of the internal short circuit resistance of the target battery may be:

$$RSC = \frac{\Delta V1 \times \int_{t1}^{t2} V2(t)dt + \Delta V2 \times \int_{t3}^{t4} V2(t)dt}{\Delta V1 \times \int_{t5}^{t6} V1(t)dt + \Delta V2 \times \int_{t5}^{t6} V1(t)dt} \times R1. \quad (1)$$

In the formula, $\Delta V1 = V1(t3) - V1(t4)$, $\Delta V2 = V2(t1) - V2(t2)$, RSC is the internal short circuit resistance of the target battery, R1 is a resistance value of a load in the balancing circuit corresponding to the reference battery, $V1(t)$ is a function of the voltage of the reference battery relative to a time variable t, and $V2(t)$ is a function of the voltage of the target battery relative to the time variable t.

In another implementation of this embodiment of this application, a calculation formula of the internal short circuit resistance of the target battery may be:

$$RSC = \frac{\Delta V1 \times \int_{t1}^{t2} V2(t)dt + \Delta V2 \times \int_{t3}^{t4} V2(t)dt}{\Delta V1 \times \int_{t5}^{t6} V1(t)dt + \Delta V2 \times \int_{t5}^{t6} V1(t)dt} \times \frac{C1}{C2} \times R1. \quad (2)$$

In the formula, C1 is a capacity of the reference battery, and C2 is a capacity of the target battery.

In an implementation of this embodiment of this application, a specific implementation of step S78 may include the following steps.

S782: Calculate a difference between the voltages of the reference battery at the third moment t1 and the fourth moment t4 based on the fifth voltage V1(t3) and the sixth voltage V1(t4).

S784: Calculate a difference between the voltages of the target battery at the first moment t1 and the second moment t2 based on the second voltage V2(t1) and the third voltage V2(t2).

S786: Calculate integral values of the voltages of the reference battery from the fifth moment t5 to the sixth moment t6, integral values of the voltages of the target battery from the first moment t1 to the second moment t2, and integral values of the voltages of the target battery from the third moment t3 to the fourth moment t4.

S788: Calculate the internal short circuit resistance of the target battery based on the difference between the voltages of the reference battery at the third moment t1 and the fourth moment t4, the difference between the voltages of the target battery at the first moment t1 and the second moment t2, the integral values of the voltages of the reference battery from the fifth moment t5 to the sixth moment t6, the integral values of the voltages of the target battery from the first moment t1 to the second moment t2, and the integral values of the voltages of the target battery from the third moment t3 to the fourth moment t4.

Further, the internal short circuit resistance of the target battery may be calculated by using the foregoing formula (1) or (2).

It should be understood that step S78 may further include other implementations. For example, when a difference between a voltage V1(t) of the reference battery and a voltage of the target battery V2(t) is relatively small, for example, when the voltage of the reference battery and the voltage of the target battery are within a preset voltage range in an entire battery charging and discharging time period of a battery, the battery management unit may calculate the internal short circuit resistance of the target battery based on the difference between the voltages of the reference battery at the third moment t3 and the fourth moment t4, the difference between the voltages of the target battery at the first moment t1 and the second moment t2, a time difference between the first moment t1 and the second moment t2, a time difference between the third moment t3 and the fourth moment t4, and a time difference between the fifth moment t5 and the sixth moment t6. The preset voltage range may be 3.1 V to 4.2 V, or may be 3.0 V to 4.5 V, or may be another voltage range whose variation amplitude is not greater than a third voltage threshold. The calculation formula may be expressed as:

$$RSC = \frac{\Delta V1 \times (t2 - t1) + \Delta V2 \times (t4 - t3)}{(\Delta V1 + \Delta V2) \times (t6 - t5)} \times R1. \quad (3)$$

It can be learned that in this implementation, the integral values are converted into time differences through calculation. In this case, although a calculation result sacrifices precision, a calculation process is simplified, so that this implementation is applicable to a scenario in which a difference between the voltage V1(t) of the reference battery and the voltage of the target battery V2(t) is relatively small.

For another example, the battery management unit may select each moment, and enable each moment to meet that a time difference between the first moment t1 and the third moment t3 and a time difference between the second moment t2 and the fourth moment t4 are not greater than first duration, a time difference between the fifth moment t5 and the first moment t1 or a time difference between the fifth moment t5 and the third moment t3 is not greater than second duration, and a time difference between the sixth moment t6 and the second moment t2 or a time difference between the sixth moment t6 and the fourth moment t4 is not greater than the second duration. Then, the battery management unit may calculate the internal short circuit resistance of the target battery based on the difference between the voltages of the reference battery at the third moment t1 and the fourth moment t4, the difference between the voltages of the target battery at the first moment t1 and the second moment t2, the time difference between the first moment t1 and the second moment t2, the time difference between the third moment t3 and the fourth moment t4, and the time difference between the fifth moment t5 and the sixth moment t6. The first duration or second duration may be 30 seconds (s), 60 s, 180 s, 300 s, or the like. This is not limited in this embodiment of this application. A specific calculation formula may be shown as the foregoing formula (3), and details are not described herein again.

It can be learned that, in this implementation, the integral values are converted into time differences through calculation, and a precision of a calculation result can be ensured while the calculation process is simplified, so that this implementation is applicable to a scenario in which the first moment t1, the third moment t3, and the fifth moment t5 are close and the second moment t2, the fourth moment t4, and the sixth moment are close.

It should be understood that, in this embodiment of this application, another form of internal resistance calculation method applicable to a special scenario may be obtained through evolution based on the foregoing formulas. This is not limited herein.

In the battery pack internal short circuit resistance detection method described in Embodiment 3, the reference battery capable of performing balanced discharging is introduced, quantitative calculation of an internal short circuit resistance may be implemented by using only a voltage of a battery in a charging process, and in a calculation process of the internal short circuit resistance, calculation is not performed based on an estimated quantity, for example, an SOC, an internal resistance, or a battery capacity. Calculation of an internal short circuit of the battery is decoupled from an estimated quantity of the battery by using a relative variation of the voltage of the battery, to reduce calculation complexity and improve calculation efficiency and precision of the internal short circuit resistance of the battery.

In an implementation of this embodiment of this application, the battery management unit may select a plurality of batteries in the battery pack as auxiliary batteries. For example, based on a voltage that is of each battery in the battery pack and that is measured in the first charging process, the battery management unit may select batteries corresponding to voltage values greater than the first voltage threshold as reference batteries, separately perform independently balanced discharging on a plurality of reference batteries, calculate internal short circuit resistances of the target battery to obtain a plurality of internal short circuit resistances of the target battery, and then determine that an actual internal short circuit resistance of the target battery is an average value of the plurality of internal short circuit resistances or a weighted average value of the plurality of internal short circuit resistances. It is assumed that there are N reference batteries, and the internal short circuit resistances of the target battery that are obtained by performing independent balanced discharging on the N reference batteries and performing calculation are $RSC_1$, $RSC_2$, ..., and $RSC_N$. If balancing time lengths of the N auxiliary batteries are respectively $T_1$, $T_2$, ..., and $T_N$, the actual internal short circuit resistance of the target battery is:

$$RSC = \frac{\sum_{i=1}^{i=N} RSC_i \times T_i}{\sum_{i=1}^{i=N} T_i}. \quad (4)$$

In the formula, N is an integer greater than 1, RSC is the actual internal short circuit resistance of the target battery, i is an index of the reference batteries, and i is a positive integer not greater than N.

By using the foregoing method, calculation accuracy and precision of an internal short circuit resistance can be further improved.

In each embodiment method in Embodiment 3, only voltages of the target battery and the reference battery at a specific moment in a charging process need to be monitored, the battery pack does not need to be fully charged or not used for a long time, and a process of quantitatively calculating an internal short circuit resistance has a relatively low requirement on a state of the battery pack, so that the method is applicable to a wide range of scenarios.

The following describes a principle of calculating the internal short circuit resistance of the target battery in Embodiment 3.

In each embodiment of this application, a voltage that is of a battery and that is measured by the battery management unit is a terminal voltage of the battery.

In Embodiment 3, the voltage $V1(t2)$ of the reference battery at the fifth moment is equal to the voltage $V1(t1)$ of the reference battery at the first moment, and the two voltages both are the first voltage $V_{set1}$, that is, $V1(t2)$ is equal to $V1(t1)$. In this case, $$V2(t1)-V2(t2)=[V1(t2)-V2(t2)]-[V1(t1)-V2(t1)]. \quad (5)$$

In the formula, according to the Kirchhoff voltage law (or Kirchhoff laws), the voltage of the battery, namely, the terminal voltage of the battery, is equal to an OCV of the battery minus a voltage drop VRC of a current on a battery impedance. To be specific, for the voltages of the reference battery and the target battery at the first moment t1 and the second moment t2, respectively, there are the following relationships:

$$V1(t2)=OCV1(t2)-VRC1(t2); \quad (6)$$

$$V2(t2)=OCV2(t2)-VRC2(t2); \quad (7)$$

$$V1(t1)=OCV1(t1)-VRC1(t1); \text{ and} \quad (8)$$

$$V2(t1)=OCV2(t1)-VRC2(t1). \quad (9)$$

Because a charging circuit of a battery is usually fixed, a voltage drop on a battery impedance almost remains unchanged at a same ambient temperature and a same SOC, that is:

$$VRC1(t1)=VRC1(t2); \text{ and} \quad (10)$$

$$VRC2(t1)=VRC2(t2). \quad (11)$$

In this case, the formulas (6), (7), (8), (9), (10), and (11) are substituted into (5) to obtain:

$$V2(t1)-V2(t2)=(OCV1(t2)-OCV2(t2)-OCV1(t1)+OCV2(t1)). \quad (12)$$

Because $\Delta OCV=\alpha\times\Delta SOC$, the following formula can be obtained by combining the formula (11):

$$V2(t1)-V2(t2)=\alpha\times(SOC1(t2)-SOC1(t0)-\alpha\times(SOC2(t2)-SOC2(t1)). \quad (13)$$

Because the voltages of the reference battery at t1 and t2 are equal, SOCs of the reference voltages at the moments t1 and t2 are approximately equal, that is:

$$SOC1(t2)-SOC1(t1)=-\int_{t1}^{t2}\frac{i}{C1}dt-\int_{t5}^{t6}\frac{V1(t)}{R1\times C1}dt=0. \quad (14)$$

In the formula (14), i is a series current that flows through all batteries and that is detected on the battery pack, and a direction in which the series current flows out of a positive electrode of a battery is defined as positive. C1 is the capacity of the reference battery. Similarly, for the target battery, the following formula may be obtained:

$$SOC2(t2)-SOC2(t1)=-\int_{t1}^{t2}\frac{i}{C2}dt-\int_{t1}^{t2}\frac{V2(t)}{RSC\times C2}dt. \quad (15)$$

In combination with the formulas (14) and (15), the formula (13) may be simplified as:

$$V2(t1)-V2(t2)=\alpha\times(\int_{t1}^{t2}\frac{V2(t)}{RSC\times C2}dt-\int_{t5}^{t6}\frac{V1(t)}{R1\times C2}dt). \quad (16)$$

Similarly, by analyzing a variation of a voltage difference between the reference battery and the target battery in a time period from t3 to t4, the following formula may also be obtained:

$$V1(t3)-V1(t4)=\alpha\times(\int_{t5}^{t6}\frac{V1(t)}{R1\times C1}dt-\int_{t3}^{t4}\frac{V2(t)}{RSC\times C1}dt). \quad (17)$$

The battery management system calculates an amount of charges flowing through a balancing resistor R1 in a time period from t5 to t6. An expression of the amount of charges is as follows:

$$\int_{t5}^{t6}\frac{V1(t)}{R1}dt. \quad (18)$$

An amount of charges that flow through the internal short circuit resistance RSC of the target battery in a time period from t1 to t2 is expressed as follows:

$$\int_{t1}^{t2}\frac{V2(t)}{RSC}dt. \quad (19)$$

An amount of charges that flow through the internal short circuit resistance RSC of the target battery in the time period from t3 to t4 is expressed as follows:

$$\int_{t3}^{t4} \frac{V2(t)}{RSC} dt. \quad (20)$$

A calculation result that is of the internal short circuit resistance of the target battery and that is obtained by eliminating an unknown variable a in combination with the formulas (16) to (20) is:

$$RSC = \frac{[V1(t3) - V1(t4)] \times \int_{t1}^{t2} V2(t)dt + [V2(t1) - V2(t2)] \times \int_{t3}^{t4} V2(t)dt}{[V1(t3) - V1(t4)] \times \int_{t5}^{t6} V1(t)dt + [V2(t1) - V2(t2)] \times \int_{t5}^{t6} V1(t)dt} \times \frac{C1}{C2} \times R1. \quad (21)$$

Usually, the capacity of the reference battery and the capacity of the target battery are very close. Therefore, C1≈C2. In this case, the formula (21) is further simplified to obtain:

$$RSC = \frac{\Delta V1 \times \int_{t1}^{t2} V2(t)dt + \Delta V2 \times \int_{t3}^{t4} V2(t)dt}{\Delta V1 \times \int_{t5}^{t6} V1(t)dt + \Delta V2 \times \int_{t5}^{t6} V1(t)dt} \times R1. \quad (22)$$

In the formula, $\Delta V1 = V1(t3) - V1(t4)$, $\Delta V2 = V2(t1) - V1(t2)$, RSC is the internal short circuit resistance of the target battery, R1 is a resistance value of a load in the balancing circuit corresponding to the reference battery, V1(t) is a function of the voltage of the reference battery relative to a time variable t, and V2(t) is a function of the voltage of the target battery relative to the time variable t.

It can be learned from the formula (22) that a final short circuit resistance calculation formula does not include any state/parameter of a battery, and is only related to a voltage of the battery.

It should be understood that when any one or more of the following two conditions are met, the formula (22) may be further simplified as:

$$RSC = \frac{\Delta V1 \times (t2 - t1) + \Delta V2 \times (t4 - t3)}{(\Delta V1 + \Delta V2) \times (t6 - t5)} \times R1. \quad (23)$$

Condition 1: A difference between the voltage V1(t) of the reference battery and the voltage of the target battery V2(t) is relatively small.

For example, in an entire charging and discharging time period of a battery, the voltage of the reference battery and the voltage of the target battery fall within a preset voltage range. The preset voltage range may be 3.1 V to 4.2 V, or may be 3.0 V to 4.5 V, or may be another voltage range whose variation amplitude is not greater than the third voltage threshold. For example, when the preset voltage range is 3.1 V to 4.2 V, and a variation range of a voltage of a battery is not greater than 30% of the maximum voltage of the battery, it may be assumed that voltages of the reference battery and the target battery are equal at a same moment or at different moments, and are approximately fixed values. Further, the integral values are converted into time differences through calculation. In this case, although a calculation result sacrifices precision, a calculation process is simplified.

Condition 2: The time difference between the first moment t1 and the third moment t3 and the time difference between the second moment t2 and the fourth moment t4 are not greater than the first duration, the time difference between the fifth moment t5 and the first moment t1 or the time difference between the fifth moment t5 and the third moment t3 is not greater than the second duration, and the time difference between the sixth moment t6 and the second moment t2 or the time difference between the sixth moment t6 and the fourth moment t4 is not greater than the second duration. The first duration or second duration may be 30 s, 60 s, 180 s, 300 s, or the like. This is not limited in this embodiment of this application. In other words, the first moment t1, the third moment t3, and the fifth moment t5 are very close, and the second moment t2, the fourth moment t4, and the sixth moment t6 are very close. In this case, the voltage of the target battery is approximately equal to the voltage of the reference battery, the foregoing integral values are converted into time differences through calculation, and a precision of a calculation result can be ensured while the calculation process is simplified.

It should be understood that, in this embodiment of this application, another form of internal resistance calculation method applicable to a special scenario may be obtained through evolution based on the foregoing formulas. This is not limited herein.

Embodiment 4

Figure 8B:
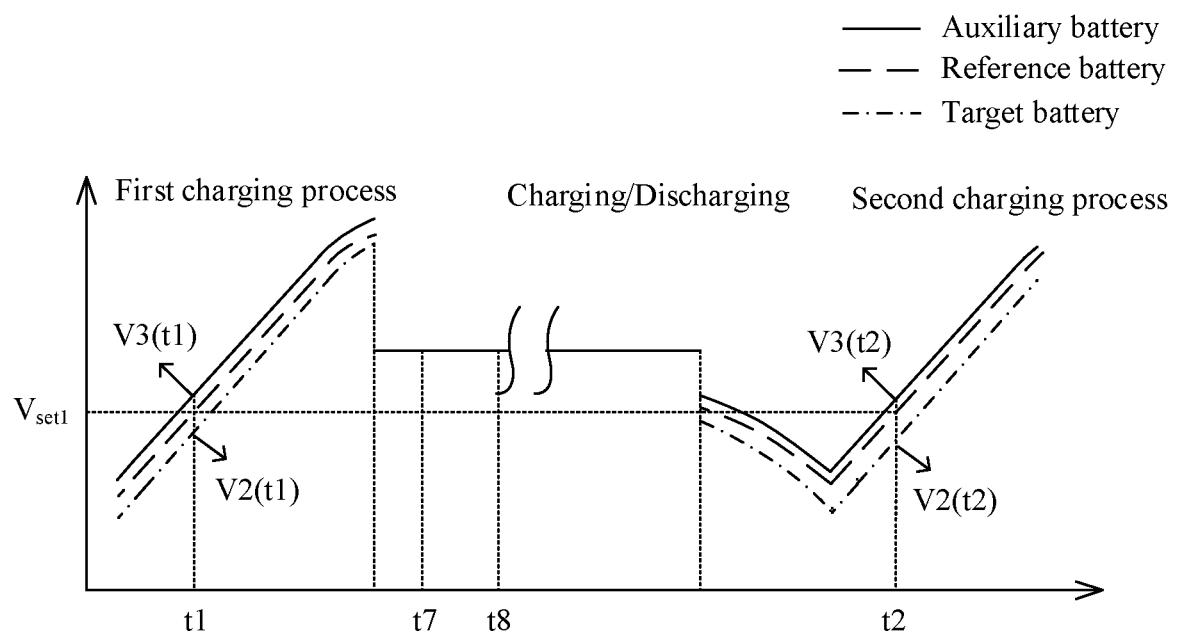
FIG. 8B is a schematic diagram of another battery internal short circuit resistance calculation principle according to an embodiment of this application.

With reference to a schematic flowchart of a battery pack internal short circuit resistance detection method shown in FIG. 8A and a schematic diagram of a battery internal short circuit resistance calculation principle shown in FIG. 8B, the following describes a battery pack internal short circuit resistance detection method according to this embodiment of this application. The method may be performed by the battery management unit 213 shown in FIG. 2, and may be performed by a security monitoring unit or a processor in the battery management unit 213. The battery management unit is used as an example for description in this embodiment of this application. It should be understood that the method may be further applied to another controller, for example, a vehicle control unit. This is not limited. An internal short circuit resistance of a battery may be quantitatively calculated by using the method, and the method may include some or all of the following steps.

S82: Measure voltages of a reference battery, a target battery, and an auxiliary battery in a first charging process of a battery pack, where a voltage value of the reference battery at a first moment t1 is a first voltage $V_{set1}$, a voltage value of the target battery at the first moment t1 is a second voltage V2(t1), a voltage value of the auxiliary battery at the first moment t1 is a seventh voltage V3(t1), and the battery pack includes the auxiliary battery, the target battery, and the reference battery.

It should be understood that a second moment t2 is a moment after the first moment t1, or the second moment t2 is a moment before the first moment t1.

In an implementation of this application, the target battery may be a battery that has an internal short circuit and that is detected by using the methods in Embodiment 1 and Embodiment 2, or may be a battery that has an internal short circuit and that is determined by using a method for qualitatively identifying a battery internal short circuit in the conventional technology. Based on a voltage that is of each battery in the battery pack and that is measured in the first charging process, the battery management unit determines that the auxiliary battery is a battery corresponding to a maximum voltage value, and determines that the reference battery is a battery corresponding to a second maximum voltage value. Alternatively, the battery management unit determines, based on a voltage that is of each battery in the battery pack and that is measured in the first charging process, that the auxiliary battery is a battery corresponding to a voltage value greater than a first voltage threshold, and then, the battery management unit may determine that the reference battery is a battery other than the auxiliary battery in batteries corresponding to voltage values greater than the first voltage threshold. The battery management unit may perform alarming at different levels based on an internal short circuit resistance of the target battery. For a specific implementation, refer to the implementation of the alarming at different levels described in Table 2. Details are not described herein again.

In another implementation of this application, the battery management unit may further determine the reference battery, the target battery, the auxiliary battery, and the like based on a voltage that is of each battery in the battery pack and that is measured in the first charging process. For a method for determining the auxiliary battery and the target battery from the battery pack, refer to related descriptions in Embodiment 1. Details are not described herein again. In this case, the battery management unit may determine, based on the internal short circuit resistance of the target battery, whether the target battery has an internal short circuit, and/or perform alarming at different levels based on a calculated internal short circuit resistance. For example, when the internal short circuit resistance of the target battery is less than a first resistance value, the target battery is identified to have an internal short circuit.

In a specific implementation, the first voltage may be a preset voltage value $V_{set1}$, the battery management unit may detect the voltages of the reference battery, the auxiliary battery, and the target battery in real time in the first charging process, determine the voltage, namely, the second voltage $V2(t1)$, of the target battery when the voltage of the reference battery is $V_{set1}$, and determine the voltage, namely, the seventh voltage $V3(t2)$, of the auxiliary battery when the voltage of the reference battery is $V_{set1}$.

Optionally, $V_{set1}$ is within an approximately linear range in an OCV-SOC curve of a battery. For details, refer to related descriptions in Embodiment 1. Details are not described herein again.

S84: Perform balanced discharging on the auxiliary battery from a seventh moment t7 to an eighth moment t8 by using a balancing circuit corresponding to the auxiliary battery, and measure voltages of the auxiliary battery from the seventh moment t7 to the eighth moment t8, where the seventh moment t7 is a moment after the first moment t1.

The seventh moment t7 is a moment after the first moment t1, and the eighth moment t8 is a moment before the second moment t2. Similar to the balanced discharging process in Embodiment 3, if a difference between a voltage $V3(t)$ of the auxiliary battery B3 and an average voltage Vavg(t) of the battery pack is not greater than a third preset threshold Vset5 (at the eighth moment t8), a switch S1 of the balancing circuit corresponding to the auxiliary battery B3 is opened, and for a specific implementation of balanced discharging, refer to related descriptions in Embodiment 3. Details are not described herein again. The eighth moment t8 is a time point at which a formula $|V3(t)-Vavg(t)| \leq V_{set5}$ is established, where time t is a variable, and $V_{set5}$ is a threshold preset by a battery management system, is determined by consistency of batteries in the battery pack, and usually may have a value ranging from 10 mV to 20 mV. The eighth moment t8 may alternatively be a moment at which a difference between the voltage of the auxiliary battery and the voltage of the target battery is not greater than a fourth preset threshold Vset6, or the eighth sixth moment t8 is determined in another manner. This is not limited.

In a time period from t7 to t8, lost power of the auxiliary battery may be expressed as $$\int_{t7}^{t8} \frac{V3(t)}{R3} dt.$$

It should be noted that the seventh moment t7 to the eighth moment t8 each may be any moment after the first moment t1 and before the second moment t2, and the battery pack may be in a charging or discharging state from the seventh moment t7 to the eighth moment t8.

S86: Measure voltages of the reference battery, the target battery, and the auxiliary battery in a second charging process of the battery pack, where a voltage value of the reference battery at the second moment t2 is the first voltage $V_{set1}$, a voltage value of the target battery at the second moment t2 is a third voltage $V2(t2)$, and a voltage value of the auxiliary battery at the second moment t2 is an eighth voltage $V3(t2)$.

In a specific implementation, the battery management unit may detect the voltages of the reference battery, the auxiliary battery, and the target battery in real time in the second charging process, determine the voltage, namely, a fifth voltage $V2(t4)$, of the target battery when the voltage of the reference battery is $V_{set1}$, and determine the voltage, namely, the eighth voltage $V3(t2)$, of the auxiliary battery when the voltage of the reference battery is $V_{set1}$.

S88: Calculate an internal short circuit resistance of the target battery based on the voltages of the auxiliary battery in the balanced discharging process, the voltages of the target battery that are measured from the first moment t1 to the second moment t2, the seventh voltage $V3(t1)$, and the eighth voltage $V3(t2)$.

In an implementation of this embodiment of this application, a calculation formula of the internal short circuit resistance of the target battery may be:

$$RSC = \frac{\Delta V3}{\Delta V2} \times \frac{\int_{t1}^{t2} V2(t)dt}{\int_{t7}^{t8} V3(t)dt} \times R3. \qquad (24)$$

In the formula, $\Delta V3=V3(t2)-V3(t1)$, $\Delta V2=V2(t2)-V1(t1)$, RSC is the internal short circuit resistance, R3 is a resistance value of a load in the balancing circuit of the auxiliary battery, RSC is the internal short circuit resistance, R3 is a resistance value of a load in the balancing circuit corresponding to the auxiliary battery, $V3(t)$ is a function of the voltage of the auxiliary battery relative to a time variable t, and $V2(t)$ is a function of the voltage of the target battery relative to the time variable t.

In another implementation of this embodiment of this application, a calculation formula of the internal short circuit resistance of the target battery may be:

$$RSC = \frac{\Delta V3}{\Delta V2} \times \frac{\int_{t1}^{t2} V2(t)dt}{\int_{t7}^{t8} V3(t)dt} \times \frac{C3}{C2} \times R3. \quad (25)$$

In the formula, C3 is a capacity of the auxiliary battery, and C2 is a capacity of the target battery.

In an implementation of this embodiment of this application, a specific implementation of step S88 may include the following steps.

S882: The battery management unit calculates a difference between the voltages of the target battery at the first moment t1 and the second moment t2 based on the second voltage V2(t1) and the third voltage V2(t2).

S884: Calculate a difference between the voltages of the auxiliary battery at the first moment t1 and the second moment t2 based on the seventh voltage V3(t1) and the eighth voltage V3(t2).

S886: Calculate integral values of the voltages of the auxiliary battery from the seventh moment t7 to the eighth moment t8, and integral values of the voltages of the target battery from the first moment t1 to the second moment t2.

S888: Calculate the internal short circuit resistance of the target battery based on the difference between the voltages of the target battery at the first moment t1 and the second moment t2, the difference between the voltages of the auxiliary battery at the first moment t1 and the second moment t2, the integral values of the voltages of the auxiliary battery from the seventh moment t7 to the eighth moment t8, and the integral values of the voltages of the target battery from the first moment t1 to the second moment t2.

Further, the internal short circuit resistance of the target battery may be calculated by using the foregoing formula (22) or (23).

It should be understood that step S88 may further include other implementations. For example, when a difference between a voltage V3(t) of the auxiliary battery and a voltage of the target battery V2(t) is relatively small, for example, when the voltage of the reference battery and the voltage of the target battery are within a preset voltage range in an entire battery charging and discharging time period of a battery, the battery management unit may calculate the internal short circuit resistance of the target battery based on the difference between the voltages of the reference battery at the first moment t1 and the second moment t2, the difference between the voltages of the target battery at the first moment t1 and the second moment t2, a time difference between the first moment t1 and the second moment t2, and a time difference between the seventh moment t7 and the eighth moment t8. The preset voltage range may be 3.1 V to 4.2 V, or may be 3.0 V to 4.5 V, or may be another voltage range whose variation amplitude is not greater than a third voltage threshold. The calculation formula may be expressed as:

$$RSC = \frac{\Delta V3}{\Delta V2} \times \frac{t2-t1}{t8-t7} \times R3. \quad (26)$$

It can be learned that in this implementation, the integral values are converted into time differences through calculation. In this case, although a calculation result sacrifices precision, a calculation process is simplified, so that this implementation is applicable to a scenario in which the difference between the voltage V3(t) of the auxiliary battery and the voltage of the target battery V2(t) is relatively small.

For another example, the battery management unit may select each moment, and enable each moment to meet that a time difference between the first moment t1 and the seventh moment t7 and a time difference between the second moment t2 and the eighth moment t8 are not greater than first duration. Then, the battery management unit may calculate the internal short circuit resistance of the target battery based on the difference between the voltages of the auxiliary battery at the first moment t1 and the second moment t2, the difference between the voltages of the target battery at the first moment t1 and the second moment t2, the time difference between the first moment t1 and the second moment t2, and the time difference between the seventh moment t7 and the eighth moment t8. The first duration or second duration may be 30 s, 60 s, 180 s, 300 s, or the like. This is not limited in this embodiment of this application. A specific calculation formula may be shown as the foregoing formula (26), and details are not described herein again.

It can be learned that, in this implementation, the integral values are converted into time differences through calculation, and a precision of a calculation result can be ensured while the calculation process is simplified, so that this implementation is applicable to a scenario in which the first moment t1 and the seventh moment t7 are close and the second moment t2 and the eighth moment t8 are close.

It should be understood that, in this embodiment of this application, another form of internal resistance calculation method applicable to a special scenario may be obtained through evolution based on the foregoing formulas. This is not limited herein.

In the battery pack internal short circuit resistance detection method described in Embodiment 4, the auxiliary battery capable of performing balanced discharging is introduced, quantitative calculation of an internal short circuit resistance may be implemented by using only a voltage of a battery in a charging process, and in a calculation process of the internal short circuit resistance, calculation is not performed based on an estimated quantity, for example, an SOC, an internal resistance, or a battery capacity. Calculation of an internal short circuit of the battery is decoupled from an estimated quantity of the battery by using a relative variation of the voltage of the battery, to reduce calculation complexity and improve calculation efficiency and precision of the internal short circuit resistance of the battery.

In an implementation of this embodiment of this application, the battery management unit may select a plurality of batteries in the battery pack as auxiliary batteries. For example, based on a voltage that is of each battery in the battery pack and that is measured in the first charging process, the battery management unit may select batteries corresponding to voltage values greater than the first voltage threshold as auxiliary batteries, select one battery other than the auxiliary batteries in batteries corresponding to the voltage values greater than the first voltage threshold as the reference battery, separately perform independently balanced discharging on a plurality of auxiliary batteries, calculate internal short circuit resistances of the target battery to obtain a plurality of internal short circuit resistances of the target battery, and then determine that an actual internal short circuit resistance of the target battery is an average value of the plurality of internal short circuit resistances or a weighted average value of the plurality of internal short circuit resistances. For a specific calculation method of the actual internal short circuit resistance of the target battery, refer to the specific calculation method of the actual internal short circuit resistance of the target battery in Embodiment 3. Details are not described herein again.

In each embodiment method in Embodiment 4, only voltages of the auxiliary battery, the target battery, and the reference battery at a specific moment in a charging process need to be monitored, the battery pack does not need to be fully charged or not used for a long time, and a process of quantitatively calculating an internal short circuit resistance has a relatively low requirement on a state of the battery pack, so that the method is applicable to a wide range of scenarios.

The following describes, with reference to FIG. 8B, a principle of calculating the internal short circuit resistance of the target battery in Embodiment 4.

In Embodiment 4, a variation of a voltage difference between the reference battery and the auxiliary battery is analyzed. The voltage $V3(t2)$ of the auxiliary battery at the second moment t2 is equal to the voltage $V3(t1)$ of the auxiliary battery at the first moment t1, and the two voltages are the first voltage $V_{set1}$, that is, $V1(t2)$ is equal to $V1(t1)$. A voltage change of the auxiliary battery may be expressed as:

$$V3(t2)-V3(t1)=[V3(t2)-V2(t2)]-[V3(t1)-V2(t1)]. \quad (27)$$

In the formula, according to the Kirchhoff voltage law (Kirchhoff laws), a terminal voltage of the battery is equal to an OCV of the battery minus a voltage drop VRC of a current on a battery impedance. To be specific, for the voltages of the auxiliary battery and the target battery at the first moment t1 and the second moment t2, respectively, there are the following relationships:

$$V1(t1)=OCV1(t1)-VRC1(t1); \quad (28)$$

$$V2(t1)=OCV2(t1)-VRC2(t1); \quad (29)$$

$$V3(t1)=OCV3(t1)-VRC3(t1); \quad (30)$$

$$V1(t2)=OCV1(t2)-VRC1(t2); \quad (31)$$

$$V2(t2)=OCV2(t2)-VRC2(t2); \text{ and} \quad (32)$$

$$V3(t2)=OCV3(t2)-VRC3(t2). \quad (33)$$

Because a charging circuit of a battery is usually fixed, a voltage drop on a battery impedance almost remains unchanged at a same ambient temperature, that is:

$$VRC1(t1)=VRC1(t2); \quad (34)$$

$$VRC2(t1)=VRC2(t2); \text{ and} \quad (35)$$

$$VRC3(t1)=VRC3(t2). \quad (36)$$

In this case, the formulas (28), (30), (31), (33), (34), and (36) are substituted into (27) to obtain:

$$V3(t2)-V3(t1)=[OCV3(t2)-OCV1(t2)-OCV3(t1)+OCV1(t1)]. \quad (37)$$

Because $\Delta OCV = \alpha \times \Delta SOC$ the following formula can be obtained by combining the formula (34):

$$V3(t2)-V3(t1)=\times[SOC3(t2)-SOC3(t1)]-\alpha\times[SOC1(t2)-SOC1(t1)]. \quad (38)$$

Referring to the simplified process in Embodiment 3, the following formula can be obtained:

$$V3(t2) - V3(t1) = -\alpha \times \int_{t7}^{t8} \frac{V3(t)}{R3 \times C3} dt. \quad (39)$$

Similarly, a variation of a voltage difference between the reference battery and the target battery is analyzed, and a difference between the voltages of the target battery at the first moment t1 and the second moment t2, to obtain the following formula:

$$V2(t2) - V2(t1) = -\alpha \times \int_{t1}^{t2} \frac{V2(t)}{RSC \times C2} dt. \quad (40)$$

A calculation result that is of the internal short circuit resistance of the target battery and that is obtained by eliminating an unknown variable a according to the formulas (36) and (37) is:

$$RSC = \frac{\Delta V3}{\Delta V2} \times \frac{\int_{t1}^{t2} V2(t)dt}{\int_{t7}^{t8} V3(t)dt} \times \frac{C3}{C2} \times R3. \quad (41)$$

In the formula, $\Delta V3 = V3(t2) \times V3(t1)$, $\Delta V2 = V2(t2) \times V1(t1)$, RSC is the internal short circuit resistance, C3 is the capacity of the auxiliary battery, C2 is the capacity of the target battery, R3 is the resistance value of the load in the balancing circuit corresponding to the auxiliary battery, $V3(t)$ is the function of the voltage of the auxiliary battery relative to the time variable t, and $V2(t)$ is the function of the voltage of the target battery relative to the time variable t.

Usually, the capacity of the auxiliary battery and the capacity of the target battery are very close. Therefore, $C3 \approx C2$. In this case, the formula (38) is further simplified as:

$$RSC = \frac{\Delta V3}{\Delta V2} \times \frac{\int_{t1}^{t2} V2(t)dt}{\int_{t7}^{t8} V3(t)dt} \times R3. \quad (42)$$

It can be learned from the formula (42) that a calculation formula of the internal short circuit resistance of the target battery does not include any state/parameter of the battery, and is only related to a voltage of the battery.

Similar to Embodiment 3, when any one or more of the following two conditions are met, the formula (42) may be further simplified as:

$$RSC = \frac{\Delta V3}{\Delta V2} \times \frac{t2 - t1}{t8 - t7} \times R3. \quad (43)$$

Condition 3: The difference between the voltage $V3(t)$ of the auxiliary battery and the voltage of the target battery $V2(t)$ is relatively small.

For example, in an entire charging and discharging time period of a battery, the voltage of the reference battery and the voltage of the target battery fall within a preset voltage range. The preset voltage range may be 3.1 V to 4.2 V, or may be 3.0 V to 4.5 V, or may be another voltage range whose variation amplitude is not greater than the third voltage threshold. For example, when the preset voltage range is 3.1 V to 4.2 V, and a variation range of a voltage of a battery is not greater than 30% of the maximum voltage of the battery, it may be assumed that voltages of the reference battery and the target battery are equal at a same moment or at different moments, and are approximately fixed values. Further, the integral values are converted into time differences through calculation. In this case, although a calculation result sacrifices precision, a calculation process is simplified.

Condition 4: Neither the time difference between the first moment t1 and the seventh moment t7 nor the time difference between the second moment t2 and the eighth moment t8 is greater than the first duration. The first duration or second duration may be 30 s, 60 s, 180 s, 300 s, or the like. This is not limited in this embodiment of this application. In other words, the first moment t1 and the seventh moment t7 are very close, and the second moment t2 and the eighth moment t8 are very close. In this case, the voltage of the target battery is approximately equal to the voltage of the reference battery, the foregoing integral values are converted into time differences through calculation, and a precision of a calculation result can be ensured while the calculation process is simplified.

It should be understood that, in this embodiment of this application, another form of internal resistance calculation method applicable to a special scenario may be obtained through evolution based on the foregoing formulas. This is not limited herein.

It should be noted that, the battery pack internal short circuit detection method described in Embodiment 3 and Embodiment 4 can implement quantitative calculation of an internal short circuit resistance of a battery. After the battery management unit obtains the internal short circuit resistance of the target battery through calculation, the battery management unit may determine an internal short circuit degree of the target battery based on the internal short circuit resistance obtained through calculation, and perform alarming at different levels based on the internal short circuit degree, for example, the specific implementation of the alarming at different levels described in the Table 3 in Embodiment 1: When the internal short circuit resistance of the target battery is greater than a preset resistance value, the battery management unit may report, to a vehicle controller, indication information used to indicate that a battery with an internal short circuit exists in the battery pack, after the vehicle controller receives the indication information, if a vehicle is in a running state, a display apparatus or a loudspeaker may output prompt information used to prompt a user that a battery is faulty or that an internal short circuit occurs in a battery, for example, the prompt information is displayed on a vehicle instrument screen, and if the vehicle is in a charging state, prompt information used to prompt the user that a battery is faulty or that an internal short circuit occurs in a battery is sent to a terminal, for example, a mobile phone, bound to the vehicle, and in this case, the vehicle controller may stop charging the battery.

The following describes apparatuses in the embodiments of this application.

Figure 1:
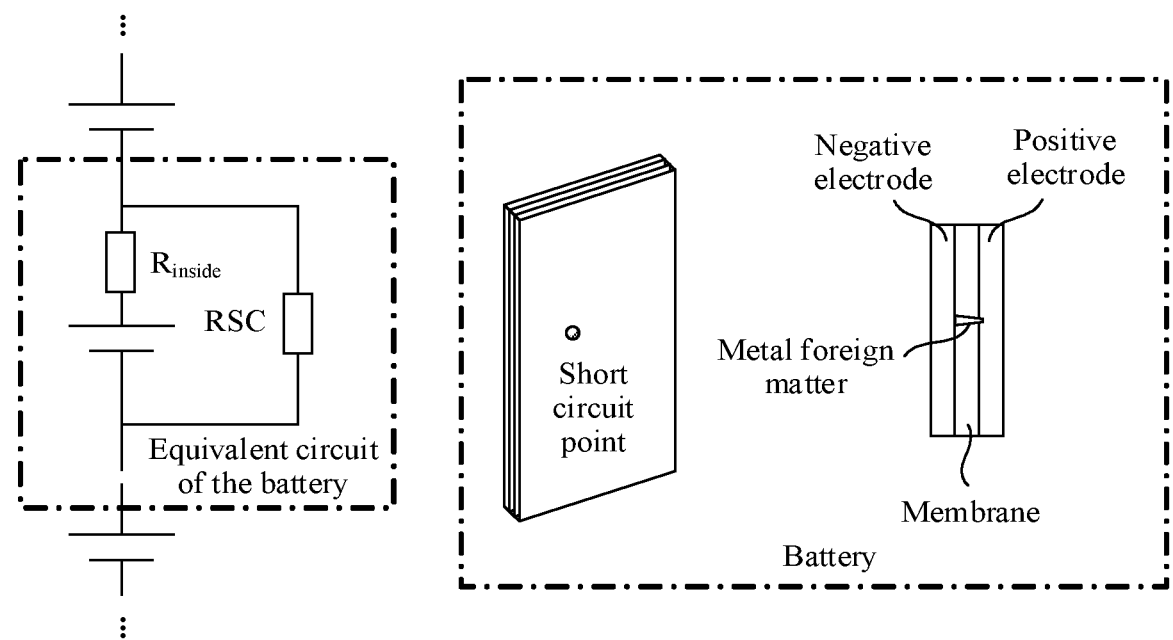
FIG. 1 is a schematic diagram of forming an internal short circuit in a lithium-ion battery in a battery pack due to a metal foreign matter piercing a membrane during manufacturing according to an embodiment of this application.
Figure 9:
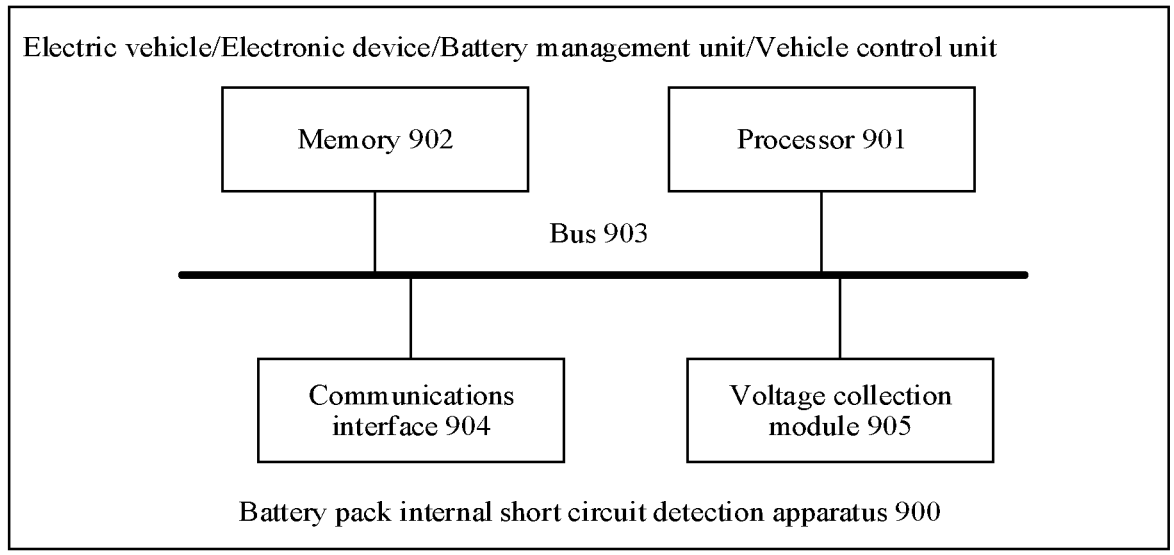
FIG. 9 is a schematic diagram of a structure of a battery pack internal short circuit detection apparatus according to an embodiment of this application.

FIG. 9 shows a battery pack internal short circuit detection apparatus, and the apparatus 90 may be an electric vehicle or an electronic device, or may be a component in an electric vehicle or an electronic device, for example, the battery management unit 213 or the vehicle control unit 24 shown in FIG. 1, or the controller 45 or the battery management unit 44 shown in FIG. 4. Alternatively, the apparatus may be a chip independently disposed in an electric vehicle or an electronic device. The battery pack internal short circuit detection apparatus may include a processor 901 and a memory 902, and the processor 901 is connected to the memory 902 by using a bus 903.

The memory 902 may be a ROM, a static storage device, a dynamic storage device, or a RAM. The memory 902 may store a program. When the program stored in the memory 902 is executed by the processor 901, the processor 901 is configured to perform the steps in the battery pack internal short circuit detection method described in Embodiment 1 of this application.

The processor 901 may be a general-purpose CPU, a microprocessor, an ASIC, a graphics processing unit (GPU), or one or more integrated circuits, and is configured to execute a related program, to perform the battery pack internal short circuit detection method described in the method embodiment 1 of this application.

The processor 901 may be an integrated circuit chip and has a signal processing capability. In an implementation process, the steps in the battery pack internal short circuit detection method described in Embodiment 1 of this application may be completed by using an integrated logic circuit of hardware in the processor 901 or by using an instruction in a form of software. The processor 901 may alternatively be a general-purpose processor, a DSP, an ASIC, an FPGA or another programmable logic device, a discrete gate or transistor logic device, or a discrete hardware component. The processor may implement or perform the methods, steps, and logical block diagrams that are disclosed in the embodiments of this application. The general-purpose processor may be a microprocessor, or the processor may be any conventional processor or the like. The steps of the methods disclosed with reference to the embodiments of this application may be directly performed and completed by using a hardware decoding processor, or may be performed and completed by using a combination of hardware and software modules in a decoding processor. A software module may be located in a mature storage medium in the art, such as a RAM, a flash memory, a ROM, a programmable ROM (PROM), an electrically EPROM (EEPROM), or a register. The storage medium is located in the memory 902, and the processor 901 reads information in the memory 902, and performs, in combination with hardware of the processor, the battery pack internal short circuit detection method described in the method embodiment 1 of this application.

Optionally, the apparatus 900 may further include a communications interface 904, and the communications interface 904 uses, for example, a transceiver apparatus that is not limited to a transceiver, to implement communication between the apparatus 900 and another device or a communications network. For example, prompt information may be sent to a terminal (for example, a mobile phone) through the communications interface 904.

Optionally, the apparatus 900 may further include a voltage collection module 905, where the voltage collection module 905 is coupled to a battery pack, and is configured to collect a terminal voltage of each battery in the battery pack. It should be understood that the voltage collection module 905 may be a part of the apparatus 900, or may be separated from the apparatus 900.

The bus 903 may be included in channels for transmitting information between various components (for example, the memory 902, the processor 901, the communications interface 904, and the voltage collection module 905) of the apparatus 900.

Further, the processor 901 is configured to obtain, by using the voltage collection module 905, voltages of a reference battery and a target battery in a first charging process of the battery pack, where a voltage value of the reference battery at a first moment t1 is a first voltage $V_{set1}$, a voltage value of the target battery at the first moment t1 is a second voltage V2(t1), and the battery pack includes the reference battery and the target battery, measure voltages of the reference battery and the target battery in a second charging process of the battery pack, where a voltage value of the reference battery at a second moment t2 is the first voltage $V_{set1}$, and a voltage value of the target battery at the second moment t2 is a third voltage V2(t2), and determine, based on the second voltage V2(t1) and the third voltage V2(t2), whether the target battery has an internal short circuit.

Optionally, if a difference between the second voltage V2(t1) and the third voltage V2(t2) is greater than a first threshold, it is determined that the target battery has an internal short circuit.

Further, the processor 901 may further calculate an internal short circuit resistance of the target battery that is in the battery pack and that has an internal short circuit, or calculate an internal short circuit resistance of any one battery or internal short circuit resistances of more batteries in the battery pack. For a specific implementation of calculating the internal short circuit resistance, refer to related descriptions in Embodiment 3 or Embodiment 4. Details are not described again in this embodiment of this application.

For an implementation of specific functions of the components of the apparatus 900, refer to related descriptions in the foregoing Embodiment 1. Details are not described herein again.

Figure 10:
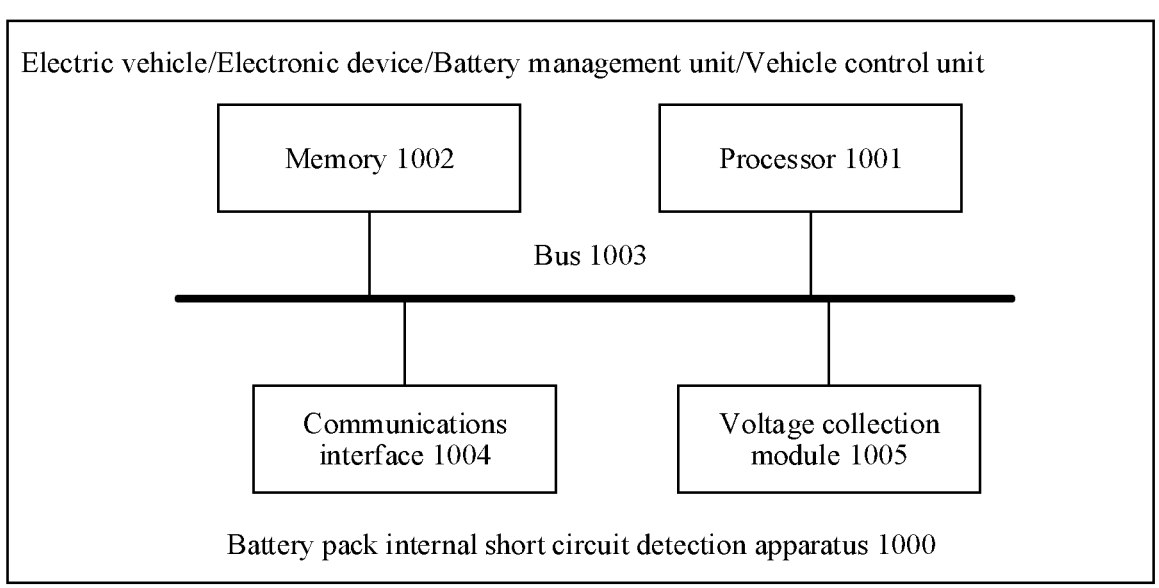
FIG. 10 is a schematic diagram of a structure of another battery pack internal short circuit detection apparatus according to an embodiment of this application.

FIG. 10 shows a battery pack internal short circuit detection apparatus, and the apparatus 100 may be an electric vehicle or an electronic device, or may be a component in an electric vehicle or an electronic device, for example, the battery management unit 213 or the vehicle control unit 24 shown in FIG. 1, or the controller 45 or the battery management unit 44 shown in FIG. 4. Alternatively, the apparatus may be a chip independently disposed in an electric vehicle or an electronic device. The battery pack internal short circuit detection apparatus may include a processor 1001 and a memory 1002, and the processor 1001 is connected to the memory 1002 by using a bus 1003.

The memory 1002 may be a ROM, a static storage device, a dynamic storage device, or a RAM. The memory 1002 may store a program. When the program stored in the memory 1002 is executed by the processor 1001, the processor 1001 is configured to perform the steps in the battery pack internal short circuit detection method described in Embodiment 2 of this application.

The processor 1001 may be a general-purpose CPU, a microprocessor, an ASIC, a GPU, or one or more integrated circuits, and is configured to execute a related program, to perform the battery pack internal short circuit detection method described in the method embodiment 2 of this application.

The processor 1001 may be an integrated circuit chip and has a signal processing capability. In an implementation process, the steps in the battery pack internal short circuit detection method described in Embodiment 1, Embodiment 2, Embodiment 3, or Embodiment 4 of this application may be completed by using an integrated logic circuit of hardware in the processor 1001 or by using an instruction in a form of software. The processor 1001 may alternatively be a general-purpose processor, a DSP, an ASIC, an FPGA or another programmable logic device, a discrete gate or transistor logic device, or a discrete hardware component. The processor may implement or perform the methods, steps, and logical block diagrams that are disclosed in the embodiments of this application. The general-purpose processor may be a microprocessor, or the processor may be any conventional processor or the like. The steps of the methods disclosed with reference to the embodiments of this application may be directly performed and completed by using a hardware decoding processor, or may be performed and completed by using a combination of hardware and software modules in a decoding processor. A software module may be located in a mature storage medium in the art, such as a RAM, a flash memory, a ROM, a PROM, an EEPROM, or a register. The storage medium is located in the memory 1002, and the processor 1001 reads information in the memory 1002, and performs, in combination with hardware of the processor, the battery pack internal short circuit detection method described in the method embodiment 2 of this application.

Optionally, the apparatus 1000 may further include a communications interface 1004, and the communications interface 1004 uses, for example, a transceiver apparatus that is not limited to a transceiver, to implement communication between the apparatus 1000 and another device or a communications network. For example, prompt information may be sent to a terminal (for example, a mobile phone) through the communications interface 1004.

Optionally, the apparatus 1000 may further include a voltage collection module 1005, where the voltage collection module 1005 is coupled to a battery pack, and is configured to collect a terminal voltage of each battery in the battery pack. It should be understood that the voltage collection module 1005 may be a part of the apparatus 1000, or may be separated from the apparatus 1000.

The bus 1003 may be included in channels for transmitting information between various components (for example, the memory 1002, the processor 1001, the communications interface 1004, and the voltage collection module 1005) of the apparatus 1000.

Further, the processor 1001 is configured to obtain, by using the voltage collection module 1005, terminal voltages of a reference battery and a target battery in a first charging process of the battery pack, where a voltage value of the target battery at a third moment t3 is a fourth voltage $V_{set2}$, a voltage value of the reference battery at the third moment t3 is a fifth voltage V1(t3), and the battery pack includes the reference battery and the target battery, measure voltages of the reference battery and the target battery in a second charging process of the battery pack, where a voltage value of the target battery at a fourth moment t4 is the fourth voltage $V_{set2}$, and a voltage value of the reference battery at the fourth moment t4 is a sixth voltage V1(t4), and determine, based on the fifth voltage V1(t3) and the sixth voltage V1(t4), whether the target battery has an internal short circuit.

Optionally, if a difference between the fifth voltage V1(t3) and the sixth voltage V1(t4) is greater than a second threshold, it is determined that the target battery has an internal short circuit.

Further, the processor 1001 may further calculate an internal short circuit resistance of the target battery that is in the battery pack and that has an internal short circuit, or calculate an internal short circuit resistance of any one battery or internal short circuit resistances of more batteries in the battery pack. For a specific implementation of calculating the internal short circuit resistance, refer to related descriptions in Embodiment 3 or Embodiment 4. Details are not described again in this embodiment of this application.

For an implementation of specific functions of the components of the apparatus 1000, refer to related descriptions in the foregoing Embodiment 1. Details are not described herein again.

Figure 11:
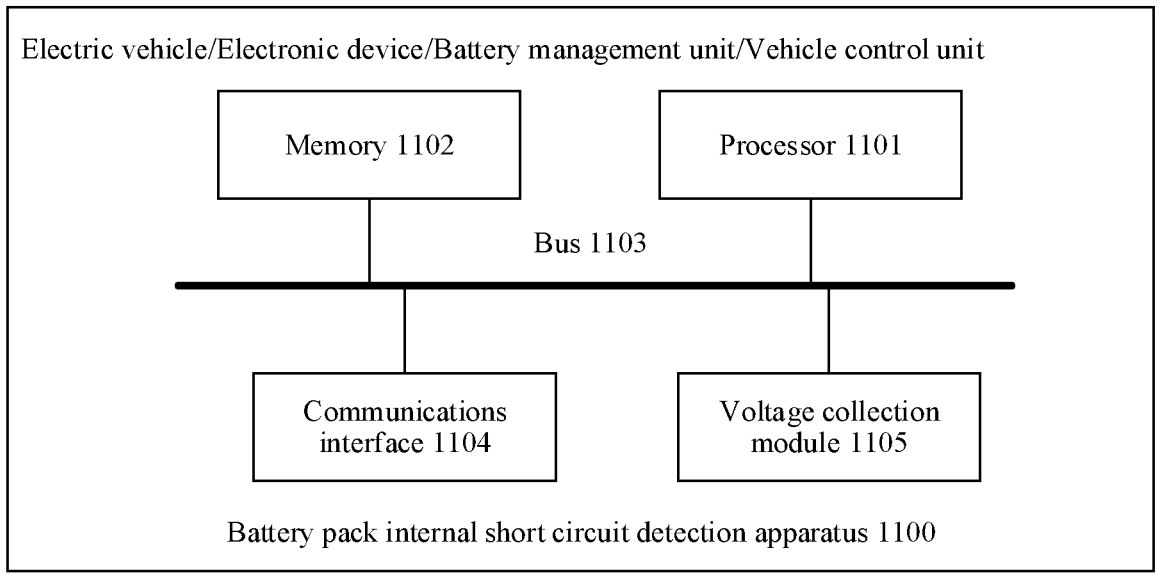
FIG. 11 is a schematic diagram of a structure of still another battery pack internal short circuit detection apparatus according to an embodiment of this application.

FIG. 11 shows a battery pack internal short circuit detection apparatus, and the apparatus 110 may be an electric vehicle or an electronic device, or may be a component in an electric vehicle or an electronic device, for example, the battery management unit 213 or the vehicle control unit 24 shown in FIG. 1, or the controller 45 or the battery management unit 44 shown in FIG. 4. Alternatively, the apparatus may be a chip independently disposed in an electric vehicle or an electronic device. The battery pack internal short circuit detection apparatus may include a processor 1101 and a memory 1102, and the processor 1101 is connected to the memory 1102 by using a bus 1103.

The memory 1102 may be a ROM, a static storage device, a dynamic storage device, or a RAM. The memory 1102 may store a program. When the program stored in the memory 1102 is executed by the processor 1101, the processor 1101 is configured to perform the steps in the battery pack internal short circuit detection method described in Embodiment 3 of this application.

The processor 1101 may be a general-purpose CPU, a microprocessor, an ASIC, a GPU, or one or more integrated circuits, and is configured to execute a related program, to perform the battery pack internal short circuit detection method described in the method embodiment 2 of this application.

The processor 1101 may be an integrated circuit chip and has a signal processing capability. In an implementation process, the steps in the battery pack internal short circuit detection method described in Embodiment 2 of this application may be completed by using an integrated logic circuit of hardware in the processor 1101 or by using an instruction in a form of software. The processor 1101 may alternatively be a general-purpose processor, a DSP, an ASIC, an FPGA or another programmable logic device, a discrete gate or transistor logic device, or a discrete hardware component. The processor may implement or perform the methods, steps, and logical block diagrams that are disclosed in the embodiments of this application. The general-purpose processor may be a microprocessor, or the processor may be any conventional processor or the like. The steps of the methods disclosed with reference to the embodiments of this application may be directly performed and completed by using a hardware decoding processor, or may be performed and completed by using a combination of hardware and software modules in a decoding processor. A software module may be located in a mature storage medium in the art, such as a RAM, a flash memory, a ROM, a PROM, an EEPROM, or a register. The storage medium is located in the memory 1102, and the processor 1101 reads information in the memory 1102, and performs, in combination with hardware of the processor, the battery pack internal short circuit detection method described in the method embodiment 3 of this application.

Optionally, the apparatus 1100 may further include a communications interface 1104, and the communications interface 1104 uses, for example, a transceiver apparatus that is not limited to a transceiver, to implement communication between the apparatus 1100 and another device or a communications network. For example, prompt information may be sent to a terminal (for example, a mobile phone) through the communications interface 1104.

Optionally, the apparatus 1100 may further include a voltage collection module 1105, where the voltage collection module 1105 is coupled to a battery pack, and is configured to collect a terminal voltage of each battery in the battery pack. It should be understood that the voltage collection module 1105 may be a part of the apparatus 1100, or may be separated from the apparatus 1100.

The bus 1103 may be included in channels for transmitting information between various components (for example, the memory 1102, the processor 1101, the communications interface 1104, and the voltage collection module 1105) of the apparatus 1100.

Further, the processor 1101 is configured to obtain, by using the voltage collection module 1105, voltages of a reference battery and a target battery in a first charging process of the battery pack, where a voltage value of the reference battery at a first moment t1 is a first voltage $V_{set1}$, a voltage value of the target battery at the first moment t1 is a second voltage $V2(t1)$, a voltage value of the target battery at the third moment t3 is a fourth voltage $V_{set2}$, a voltage value of the reference battery at the third moment t3 is a fifth voltage $V1(t3)$, and the battery pack includes the reference battery and the target battery, perform balanced discharging on the reference battery from a fifth moment t5 to a sixth moment t6 by using a balancing circuit corresponding to the reference battery, and obtain, by using the voltage collection module 1105, voltages of the reference battery from the fifth moment t5 to the sixth moment t6, where the fifth moment t5 is a moment after the third moment t3, obtain, by using the voltage collection module 1105, voltages of the reference battery and the target battery in a second charging process of the battery pack, where a voltage value of the reference battery at a second moment t2 is the first voltage $V_{set1}$, a voltage value of the target battery at the second moment t2 is a third voltage $V2(t2)$, a voltage value of the target battery at a fourth moment t4 is a fourth voltage $V_{set2}$, and a voltage value of the reference battery at the fourth moment t2 is a sixth voltage $V1(t4)$, and calculate an internal short circuit resistance of the target battery based on voltages of the reference battery in a balanced discharging process, the voltages of the target battery that are measured from the first moment t1 to the fourth moment t4, the fifth voltage $V1(t3)$, and the sixth voltage $V1(t4)$.

For an implementation of specific functions of the components of the apparatus 1100, refer to related descriptions in the foregoing Embodiment 3. Details are not described herein again.

Figure 12:
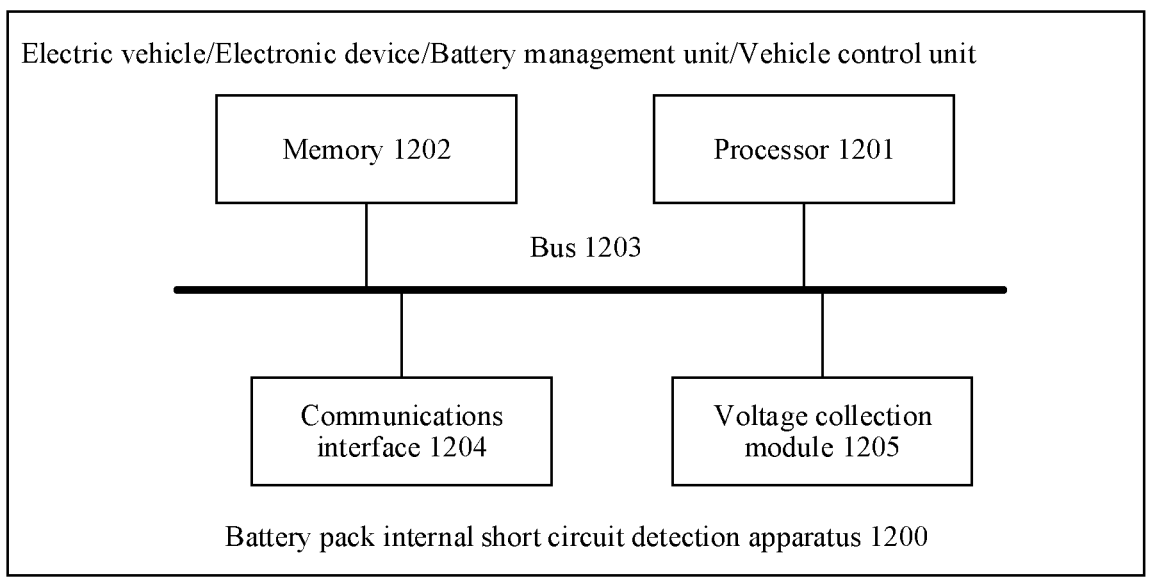
FIG. 12 is a schematic diagram of a structure of still another battery pack internal short circuit detection apparatus according to an embodiment of this application.

FIG. 12 shows a battery pack internal short circuit detection apparatus, and the apparatus 120 may be an electric vehicle or an electronic device, or may be a component in an electric vehicle or an electronic device, for example, the battery management unit 213 or the vehicle control unit 24 shown in FIG. 1, or the controller 45 or the battery management unit 44 shown in FIG. 4. Alternatively, the apparatus may be a chip independently disposed in an electric vehicle or an electronic device. The battery pack internal short circuit detection apparatus may include a processor 1201 and a memory 1202, and the processor 1201 is connected to the memory 1202 by using a bus 1203.

The memory 1202 may be a ROM, a static storage device, a dynamic storage device, or a RAM. The memory 1202 may store a program. When the program stored in the memory 1202 is executed by the processor 1201, the processor 1201 is configured to perform the steps in the battery pack internal short circuit detection method described in Embodiment 4 of this application.

The processor 1201 may be a general-purpose CPU, a microprocessor, an ASIC, a GPU, or one or more integrated circuits, and is configured to execute a related program, to perform the battery pack internal short circuit detection method described in the method embodiment 4 of this application.

The processor 1201 may be an integrated circuit chip and has a signal processing capability. In an implementation process, the steps in the battery pack internal short circuit detection method described in Embodiment 4 of this application may be completed by using an integrated logic circuit of hardware in the processor 1201 or by using an instruction in a form of software. The processor 1201 may alternatively be a general-purpose processor, a DSP, an ASIC, an FPGA or another programmable logic device, a discrete gate or transistor logic device, or a discrete hardware component. The processor may implement or perform the methods, steps, and logical block diagrams that are disclosed in the embodiments of this application. The general-purpose processor may be a microprocessor, or the processor may be any conventional processor or the like. The steps of the methods disclosed with reference to the embodiments of this application may be directly performed and completed by using a hardware decoding processor, or may be performed and completed by using a combination of hardware and software modules in a decoding processor. A software module may be located in a mature storage medium in the art, such as a RAM, a flash memory, a ROM, a PROM, an EEPROM, or a register. The storage medium is located in the memory 1202, and the processor 1201 reads information in the memory 1202, and performs, in combination with hardware of the processor, the battery pack internal short circuit detection method described in the method embodiment 4 of this application.

Optionally, the apparatus 1200 may further include a communications interface 1204, and the communications interface 1204 uses, for example, a transceiver apparatus that is not limited to a transceiver, to implement communication between the apparatus 1200 and another device or a communications network. For example, prompt information may be sent to a terminal (for example, a mobile phone) through the communications interface 1204.

Optionally, the apparatus 1200 may further include a voltage collection module 1205, where the voltage collection module 1205 is coupled to a battery pack, and is configured to collect a terminal voltage of each battery in the battery pack.

The bus 1203 may be included in channels for transmitting information between various components (for example, the memory 1202, the processor 1201, the communications interface 1204, and the voltage collection module 1205) of the apparatus 1200.

Further, the processor 1201 is configured to obtain, by using the voltage collection module 1205, voltages of a reference battery, a target battery, and an auxiliary battery in a first charging process of the battery pack, where a voltage value of the reference battery at a first moment t1 is a first voltage $V_{set1}$, a voltage value of the target battery at the first moment t1 is a second voltage $V2(t1)$, a voltage value of the auxiliary battery at the first moment t1 is a seventh voltage $V3(t1)$, and the battery pack includes the auxiliary battery, the target battery, and the reference battery, perform balanced discharging on the auxiliary battery from a seventh moment t7 to an eighth moment t8 by using a balancing circuit corresponding to the auxiliary battery, and obtain, by using the voltage collection module 1205, voltages of the auxiliary battery from the seventh moment t7 to the eighth moment t8, where the seventh moment t7 is a moment after the first moment t1, obtain, by using the voltage collection module 1205, voltages of the reference battery, the target battery, and the auxiliary battery in a second charging process of the battery pack, where a voltage value of the reference battery at a second moment t2 is the first voltage $V_{set1}$, a voltage value of the target battery at the second moment t2 is a third voltage $V2(t2)$, and a voltage value of the auxiliary battery at the second moment t2 is an eighth voltage $V3(t2)$, and calculate an internal short circuit resistance of the target battery based on the voltages of the auxiliary battery in the balanced discharging process, the voltages of the target battery that are measured from the first moment t1 to the second moment t2, the seventh voltage $V3(t1)$, and the eighth voltage $V3(t2)$.

For an implementation of specific functions of the components of the apparatus 1200, refer to related descriptions in the foregoing Embodiment 4. Details are not described herein again.

It should be noted that although only the memory, the processor, and the communications interface of each of the apparatuses 900, 1000, 1100, and 1200 shown in FIG. 9 to FIG. 12 are illustrated, in a specific implementation process, a person skilled in the art should understand that the apparatuses 900, 1000, 1100, and 1200 each further include other components necessary for implementing normal operations. In addition, according to a specific requirement, a person skilled in the art should understand that the apparatus 900, 1000, 1100, and 1200 each may further include hardware components for implementing other additional functions. In addition, a person skilled in the art should understand that the apparatuses 900, 1000, 1100, and 1200 each may include only components necessary for implementing the embodiments of this application, and do not need to include all the components in the apparatus shown in FIG. 9, FIG. 10, FIG. 11, or FIG. 12.

For example, the apparatuses 900, 1000, 1100, and 1200 each may further include a user interface. The user interface is configured to provide information to or receive information from a user of the apparatus 900, 1000, 1100, or 1200. Optionally, the user interface may include one or more input/output devices in a set of peripheral devices, for example, a wireless communications system, a vehicle-mounted computer, a microphone, and a speaker.

Optionally, when identifying that the target battery has an internal short circuit or obtaining, through calculation, that the internal short circuit resistance of the target battery is greater than a preset resistance value, the apparatuses 900, 1000, 1100, and 1200 each may send prompt information to a terminal, for example, a mobile phone, by using the communications interface, or may output, by using a peripheral device, prompt information to prompt the user, for example, display the prompt information on a display.

In an implementation of this embodiment of this application, the battery pack internal short circuit detection apparatus, the battery pack, a balancing circuit module, and the voltage collection module are disposed in a same device, for example, an electric vehicle. In this case, the battery pack internal short circuit detection apparatus may collect a voltage of each battery in the battery pack by using the voltage collection module, to further identify whether a battery has an internal short circuit, and calculate an internal short circuit resistance of the battery.

In an implementation of this embodiment of this application, the battery pack internal short circuit detection apparatus may be a server, a cloud, or the like, and the electric vehicle or the terminal may include a battery pack, a balancing circuit module, a voltage collection module, and a communications interface. The electric vehicle or the terminal may collect a voltage of each battery in the battery pack by using the voltage collection module, and send the voltage to the battery pack internal short circuit detection apparatus. The battery pack internal short circuit detection apparatus identifies, based on the collected voltage, whether a battery has an internal short circuit, and the apparatus calculates an internal short circuit resistance of the battery.

A person skilled in the art can understand that the functions described with reference to various illustrative logical blocks, modules, and algorithm steps disclosed and described in this specification can be implemented by hardware, software, firmware, or any combination thereof. If the functions are implemented by software, the functions described with reference to the illustrative logical blocks, modules, and steps may be stored in or transmitted over a computer-readable medium as one or more instructions or code and executed by a hardware-based processing unit. The computer-readable medium may include a computer-readable storage medium, which corresponds to a tangible medium such as a data storage medium, or a communications medium including any medium that facilitates transfer of a computer program from one place to another (for example, according to a communication protocol). In this manner, the computer-readable medium may generally correspond to: (1) a non-transitory tangible computer-readable storage medium, or (2) a communications medium such as a signal or a carrier. The data storage medium may be any usable medium that can be accessed by one or more computers or one or more processors to retrieve instructions, code, and/or data structures for implementing the technologies described in this application. A computer program product may include the computer-readable medium.

In an example but not a limitation, such computer-readable storage media may include a RAM, a ROM, an EEPROM, a CD-ROM or another compact disc storage apparatus, a magnetic disk storage apparatus or another magnetic storage apparatus, a flash memory, or any other medium that can be used to store desired program code in a form of instructions or a data structure and that is accessible by a computer. In addition, any connection is properly referred to as a computer-readable medium. For example, if instructions are transmitted from a website, a server, or another remote source through a coaxial cable, an optical fiber, a twisted pair, a digital subscriber line (DSL), or wireless technologies such as infrared, radio, and microwave, the coaxial cable, the optical fiber, the twisted pair, the DSL, or the wireless technologies such as infrared, radio, and microwave are included in a definition of the medium. However, it should be understood that the computer-readable storage medium and the data storage medium do not include connections, carriers, signals, or other transitory media, but actually mean non-transitory tangible storage media. Disks and discs used in this specification include a CD, a laser disc, an optical disc, a DIGITAL VERSATILE DISC (DVD), and a BLU-RAY DISC. The disks usually reproduce data magnetically, whereas the discs reproduce data optically with lasers. Combinations of the foregoing items should also be included in the scope of the computer-readable media.

An instruction may be executed by one or more processors such as one or more DSPs, a general microprocessor, an ASIC, an FPGA, or an equivalent integrated circuit or discrete logic circuits. Therefore, the term "processor" used in this specification may refer to the foregoing structure, or any other structure that may be applied to implementation of the technologies described in this specification. In addition, in some aspects, the functions described with reference to the illustrative logical blocks, modules, and steps described in this specification may be provided within dedicated hardware and/or software modules configured for encoding and decoding, or may be incorporated into a combined codec. In addition, the technologies may be completely implemented in one or more circuits or logic elements.

The technologies in this application may be implemented in various apparatuses or devices, including a wireless handset, an integrated circuit (IC), or a set of ICs (for example, a chip set). Various components, modules, or units are described in this application to emphasize functional aspects of the apparatuses configured to perform the disclosed technologies, but are not necessarily implemented by different hardware units. Actually, as described above, various units may be combined into a codec hardware unit in combination with appropriate software and/or firmware, or may be provided by interoperable hardware units (including the one or more processors described above).

The foregoing descriptions are merely specific example implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. A battery pack internal short circuit detection method comprising:

measuring voltages of a reference battery of a battery pack and a target battery of the battery pack during a first charging process of the battery pack, wherein a voltage value of the reference battery at a first moment (t1) is a first voltage ($V_{set1}$), wherein a voltage value of the target battery at t1 is a second voltage (V2(t1)), and wherein t1 is during the first charging process;

measuring voltages of the reference battery and the target battery during a second charging process of the battery pack, wherein a voltage value of the reference battery at a second moment (t2) is $V_{set1}$, wherein a voltage value of the target battery at t2 is a third voltage (V2(t2)), and wherein t2 is during the second charging process; and determining, based on V2(t1) and V2(t2), whether the target battery has an internal short circuit.

2. The battery pack internal short circuit detection method of claim 1, further comprising:

making a determination that a difference between V2(t1) and V2(t2) is greater than a threshold; and determining, in response to the determination, that the target battery has the internal short circuit.

3. The battery pack internal short circuit detection method of claim 1, wherein during the first charging process, a voltage value of the target battery at a third moment (t3) is a fourth voltage ($V_{set2}$) and a voltage value of the reference battery at t3 is a fifth voltage (V1(t3)), wherein during the second charging process, a voltage value of the target battery at a fourth moment (t4) is $V_{set2}$ and a voltage value of the reference battery at t4 is a sixth voltage (V1(t4)), and wherein the battery pack internal short circuit detection method further comprises:

performing balanced discharging on the reference battery from a fifth moment (t5) to a sixth moment (t6), wherein t5 is after t3, and wherein t6 is before t2;

measuring voltages of the reference battery during a balanced discharging process; and calculating an internal short circuit resistance of the target battery based on the voltages of the reference battery during the balanced discharging process, voltages of the target battery that are measured from t1 to t4, V1(t3), and V1(t4) after the battery pack is charged for a second time.

4. The battery pack internal short circuit detection method of claim 3, further comprising:
making a determination that the internal short circuit resistance is less than a resistance value; and
determining, in response to the determination, that the target battery has the internal short circuit.

5. The battery pack internal short circuit detection method of claim 1, further comprising:
detecting a voltage of an auxiliary battery during the first charging process of the battery pack, wherein a voltage value of the auxiliary battery at t1 is a seventh voltage (V3(t1)), and wherein the voltage of the auxiliary battery is higher than the voltage of the target battery;
performing balanced discharging on the auxiliary battery from a seventh moment (t7) to an eighth moment (t8), wherein t7 is after t1, and wherein t8 is before t2;
measuring voltages of the auxiliary battery during a balanced discharging process;
detecting a voltage of the auxiliary battery during the second charging process of the battery pack, wherein a voltage value of the auxiliary battery at t2 is an eighth voltage (V3(t2)); and
calculating an internal short circuit resistance of the target battery based on the voltages of the auxiliary battery during the balanced discharging process, voltages of the target battery that are measured from t1 to t2, V3(t1), and V3(t2).

6. The battery pack internal short circuit detection method of claim 5, further comprising:
making a determination that the internal short circuit resistance is less than a resistance value; and
determining, in response to the determination, that the target battery has the internal short circuit.

7. A battery pack internal short circuit detection method comprising:
measuring terminal voltages of a reference battery of a battery pack and a target battery of the battery pack during a first charging process of the battery pack, wherein a voltage value of the target battery at a third moment (t3) is a fourth voltage ($V_{set2}$), wherein a voltage value of the reference battery at t3 is a fifth voltage (V1(t3)), and wherein t3 is during the first charging process;
measuring voltages of the reference battery and the target battery during a second charging process of the battery pack, wherein a voltage value of the target battery at a fourth moment (t4) is $V_{set2}$, wherein a voltage value of the reference battery at t4 is a sixth voltage (V1(t4)), and wherein t4 is during the second charging process; and
determining, based on V1(t3) and V1(t4), whether the target battery has an internal short circuit.

8. The battery pack internal short circuit detection method of claim 7, further comprising:
making a determination that a difference between V1(t3) and V1(t4) is greater than a threshold; and
determining, in response to the determination, that the target battery has the internal short circuit.

9. The battery pack internal short circuit detection method of claim 7, wherein during the first charging process, a voltage value of the reference battery at a first moment (t1) is a first voltage ($V_{set1}$) and a voltage value of the target battery at t1 is a second voltage (V2(t1)), wherein during the second charging process, a voltage value of the reference battery at a second moment (t2) is $V_{set1}$ and a voltage value of the target battery at t2 is a third voltage (V2(t2)), and wherein the battery pack internal short circuit detection method further comprises:
performing balanced discharging on the reference battery from a fifth moment (t5) to a sixth moment (t6), wherein t5 is after t3, and wherein t6 is before t2;
measuring voltages of the reference battery during a balanced discharging process; and
calculating an internal short circuit resistance of the target battery based on the voltages of the reference battery during the balanced discharging process, voltages of the target battery that are measured from t1 to t4, V1(t3), and V1(t4) after the battery pack is charged for a second time.

10. The battery pack internal short circuit detection method of claim 9, further comprising:
making a determination that the internal short circuit resistance is less than a resistance value; and
determining, in response to the determination, that the target battery has the internal short circuit.

11. The battery pack internal short circuit detection method of claim 7, further comprising:
detecting a voltage of an auxiliary battery during the first charging process of the battery pack, wherein a voltage value of the reference battery at a first moment (t1) is a first voltage ($V_{set1}$), wherein a voltage value of the target battery at t1 is a second voltage (V2(t1)), wherein a voltage value of the auxiliary battery at t1 is a seventh voltage (V3(t1)), and wherein the voltage of the auxiliary battery is higher than the voltage of the target battery;
performing balanced discharging on the auxiliary battery from a seventh moment (t7) to an eighth moment (t8), wherein t7 is after t1;
measuring voltages of the auxiliary battery during a balanced discharging process;
detecting a voltage of the auxiliary battery during the second charging process of the battery pack, wherein a voltage value of the reference battery at a second moment (t2) is $V_{set1}$, wherein a voltage value of the target battery at t2 is a third voltage (V2(t2)), wherein a voltage value of the auxiliary battery at t2 is an eighth voltage (V3(t2)), and wherein t2 is after t8; and
calculating an internal short circuit resistance of the target battery based on the voltages of the auxiliary battery during the balanced discharging process, voltages of the target battery that are measured from t1 to t2, V3(t1), and V3(t2).

12. The battery pack internal short circuit detection method of claim 11, further comprising:
making a determination that the internal short circuit resistance is less than a resistance value; and
determining, in response to the determination, that the target battery has the internal short circuit.

13. A battery pack internal short circuit detection apparatus comprising:
a memory configured to store program code; and
one or more processors coupled to the memory and configured to execute the program code to cause the battery pack internal short circuit detection apparatus to:
obtain voltages of a reference battery of a battery pack and a target battery of the battery pack during a first charging process of the battery pack, wherein a voltage value of the reference battery at a first moment (t1) is a first voltage ($V_{set1}$), wherein a voltage value of the target battery at t1 is a second voltage (V2(t1)), and wherein t1 is during the first charging process;
measure voltages of the reference battery and the target battery during a second charging process of the battery pack, wherein a voltage value of the reference battery at a second moment (t2) is $V_{set1}$, wherein a voltage value of the target battery at t2 is a third voltage (V2(t2)), and wherein t2 is during the second charging process; and
determine, based on V2(t1) and V2(t2), whether the target battery has an internal short circuit.

14. The battery pack internal short circuit detection apparatus of claim 13, wherein the one or more processors are further configured to execute the program code to cause the battery pack internal short circuit detection apparatus to:
make a determination that a difference between V2(t1) and V2(t2) is greater than a threshold; and
determine, in response to the determination, that the target battery has the internal short circuit.

15. The battery pack internal short circuit detection apparatus of claim 13, wherein during the first charging process, a voltage value of the target battery at a third moment (t3) is a fourth voltage ($V_{set2}$) and a voltage value of the reference battery at t3 is a fifth voltage (V1(t3)), wherein during the second charging process, a voltage value of the target battery at a fourth moment (t4) is $V_{set2}$ and a voltage value of the reference battery at t4 is a sixth voltage (V1(t4)), and wherein the one or more processors are further configured to execute the program code to cause the battery pack internal short circuit detection apparatus to:
control the reference battery to perform balanced discharging from a fifth moment (t5) to a sixth moment (t6), wherein t5 is after t3, and wherein t6 is before t2;
measure voltages of the reference battery during a balanced discharging process; and
calculate an internal short circuit resistance of the target battery based on the voltages of the reference battery during the balanced discharging process, voltages of the target battery that are measured from t1 to t4, V1(t3), and V1(t4) after the battery pack is charged for a second time.

16. The battery pack internal short circuit detection apparatus of claim 13, wherein the one or more processors are further configured to execute the program code to cause the battery pack internal short circuit detection apparatus to:
obtain a voltage of an auxiliary battery during the first charging process of the battery pack, wherein a voltage value of the auxiliary battery at t1 is a seventh voltage (V3(t1)), and wherein the voltage of the auxiliary battery is higher than the voltage of the target battery;
control the auxiliary battery to perform balanced discharging from a seventh moment (t7) to an eighth moment (t8), wherein t7 is after t1, and wherein t8 is before t2;
obtain voltages of the auxiliary battery during a balanced discharging process;
obtain a voltage of the auxiliary battery during the second charging process of the battery pack, wherein a voltage value of the auxiliary battery at t2 is an eighth voltage (V3(t2)); and
calculate an internal short circuit resistance of the target battery based on the voltages of the auxiliary battery during the balanced discharging process, voltages of the target battery that are measured from t1 to t2, V3(t1), and V3(t2).

17. A battery pack internal short circuit detection apparatus comprising:
a memory configured to store program code; and
one or more processors coupled to the memory and configured to execute the program code to cause the battery pack internal short circuit detection apparatus to:
obtain terminal voltages of a reference battery of a battery pack and a target battery of the battery pack during a first charging process of the battery pack, wherein a voltage value of the target battery at a third moment (t3) is a fourth voltage ($V_{set2}$), wherein a voltage value of the reference battery at t3 is a fifth voltage (V1(t3)), and wherein t3 is during the first charging process;
measure voltages of the reference battery and the target battery during a second charging process of the battery pack, wherein a voltage value of the target battery at a fourth moment (t4) is $V_{set2}$, wherein a voltage value of the reference battery at t4 is a sixth voltage (V1(t4)), and wherein t4 is during the second charging process; and
determine, based on V1(t3) and V1(t4), whether the target battery has an internal short circuit.

18. The battery pack internal short circuit detection apparatus of claim 17, wherein the one or more processors are further configured to execute the program code to cause the battery pack internal short circuit detection apparatus to:
make a determination that a difference between V1(t3) and V1(t4) is greater than a threshold; and
determine, in response to the determination, that the target battery has the internal short circuit.

19. The battery pack internal short circuit detection apparatus of claim 17, wherein during the first charging process, a voltage value of the reference battery at a first moment (t1) is a first voltage ($V_{set1}$) and a voltage value of the target battery at t1 is a second voltage (V2(t1)), wherein during the second charging process, a voltage value of the reference battery at a second moment (t2) is $V_{set1}$ and a voltage value of the target battery at t2 is a third voltage (V2(t2)), and wherein the one or more processors are further configured to execute the program code to cause the battery pack internal short circuit detection apparatus to:
control the reference battery to perform balanced discharging from a fifth moment (t5) to a sixth moment (t6), wherein t5 is after t3, and wherein t6 is before t2;
measure voltages of the reference battery during a balanced discharging process; and
calculate an internal short circuit resistance of the target battery based on the voltages of the reference battery during the balanced discharging process, voltages of the target battery that are measured from t1 to t4, V1(t3), and V1(t4) after the battery pack is charged for a second time.

20. The battery pack internal short circuit detection apparatus of claim 17, wherein the one or more processors are further configured to execute the program code to cause the battery pack internal short circuit detection apparatus to:
obtain a voltage of an auxiliary battery during the first charging process of the battery pack, wherein a voltage value of the reference battery at a first moment (t1) is a first voltage ($V_{set1}$), wherein a voltage value of the target battery at t1 is a second voltage (V2(t1)), wherein a voltage value of the auxiliary battery at t1 is a seventh voltage (V3(t1)), and wherein the voltage of the auxiliary battery is higher than the voltage of the target battery;

control the auxiliary battery to perform balanced discharging from a seventh moment (t7) to an eighth moment (t8), wherein t7 is after t1;
obtain voltages of the auxiliary battery during a balanced discharging process;
obtain a voltage of the auxiliary battery during the second charging process of the battery pack, wherein a voltage value of the reference battery at a second moment (t2) is $V_{set1}$, wherein a voltage value of the target battery at t2 is a third voltage (V2(t2)), wherein a voltage value of the auxiliary battery at t2 is an eighth voltage (V3(t2)), and wherein t2 is after t8; and
calculate an internal short circuit resistance of the target battery based on the voltages of the auxiliary battery during the balanced discharging process, voltages of the target battery that are measured from t1 to t2, V3(t1), and V3(t2).

* * * * *

UNITED STATES PATENT AND TRADEMARK OFFICE
CERTIFICATE OF CORRECTION

PATENT NO. : 12,420,667 B2
APPLICATION NO. : 17/490242
DATED : September 23, 2025
INVENTOR(S) : Rui Yang, Wei Cai and Lulu Zheng It is certified that error appears in the above-identified patent and that said Letters Patent is hereby corrected as shown below:

In the Claims

Claim 15, Column 51, Line 29: "t4 is a sixth voltage" should read "t4 and in reference to $V_{set2}$ is a sixth voltage"

Signed and Sealed this
Twenty-eighth Day of October, 2025

John A. Squires
*Director of the United States Patent and Trademark Office*